US008276038B2

(12) United States Patent
Cideciyan et al.

(10) Patent No.: US 8,276,038 B2
(45) Date of Patent: Sep. 25, 2012

(54) DATA STORAGE SYSTEMS

(75) Inventors: Roy D. Cideciyan, Rueschlikon (CH);
Ajay Dholakia, Gattikon (CH);
Evangelos S. Eleftheriou, Zurich (CH);
Richard L. Galbraith, Rochester, MN (US); Weldon M. Hanson, Rochester, MN (US); Thomas Mittelholzer, Zurich (CH); Travis R. Oenning, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1392 days.

(21) Appl. No.: 11/833,274

(22) Filed: Aug. 3, 2007

(65) Prior Publication Data

US 2008/0055125 A1   Mar. 6, 2008

(51) Int. Cl.
*H03M 7/46* (2006.01)
*H03M 13/03* (2006.01)
*G11B 20/18* (2006.01)

(52) U.S. Cl. .................. 714/755; 341/54; 714/769
(58) Field of Classification Search .......... 714/755, 714/769
See application file for complete search history.

(56) References Cited

U.S. PATENT DOCUMENTS 5,757,294 A     5/1998 Fisher et al. ............... 341/59
6,154,870 A *  11/2000 Fredrickson et al. ....... 714/786
6,388,587 B1 *  5/2002 Brickner et al. ............ 341/59
6,408,419 B1 *  6/2002 Karabed et al. ............ 714/792
6,643,814 B1 * 11/2003 Cideciyan et al. .......... 714/755
6,732,328 B1 *  5/2004 McEwen et al. ............ 714/795
6,753,797 B2 *  6/2004 Bliss et al. .................. 341/59

(Continued)

FOREIGN PATENT DOCUMENTS

JP      2001266499       9/2001

(Continued)

OTHER PUBLICATIONS

Form PCT/ISA/210 for International Application No. PCT/IB2004/003761.

(Continued)

*Primary Examiner* — Stephen Baker
(74) *Attorney, Agent, or Firm* — Ido Tuchman; William J. Stock

(57) ABSTRACT

A data storage system includes an encoder subsystem comprising an error correction code encoder, a modulation encoder, and a precoder, and a decoder subsystem similarly comprising a detector, an inverse precoder, a channel decoder, and an error correction code decoder. The error correction encoder applies an error correction code to the incoming user bit stream, and the modulation encoder applies so-called modulation or constrained coding to the error correction coded bit stream. The precoder applies so-called precoding to the modulation encoded bit stream. However, this precoding is applied to selected portions of the bit stream only. There can also be a permutation step where the bit sequence is permuted after the modulation encoder before precoding is applied by the precoder. The decoder subsystem operates in the inverse manner.

12 Claims, 39 Drawing Sheets

U.S. PATENT DOCUMENTS

| | | | |
|---|---|---|---|
| 6,788,223 B2 * | 9/2004 | Bliss et al. | 341/50 |
| 6,795,947 B1 * | 9/2004 | Siegel et al. | 714/802 |
| 7,053,801 B2 * | 5/2006 | Bliss et al. | 341/50 |
| 7,137,056 B2 * | 11/2006 | Ashley et al. | 714/758 |
| 7,395,482 B2 * | 7/2008 | Cideciyan et al. | 714/752 |
| 7,486,456 B2 * | 2/2009 | Bliss et al. | 360/29 |
| 7,530,003 B2 * | 5/2009 | Lee et al. | 714/759 |
| 2002/0057640 A1 | 5/2002 | Hattori et al. | 369/59.24 |
| 2003/0185310 A1 | 10/2003 | Ketchum et al. | 375/259 |
| 2005/0020237 A1 | 1/2005 | Alexiou et al. | 455/403 |
| 2005/0157804 A1 | 7/2005 | Jones | 375/261 |
| 2005/0235034 A1 | 10/2005 | Chen et al. | 709/206 |

FOREIGN PATENT DOCUMENTS

| | | |
|---|---|---|
| JP | 2000322842 A | 11/2004 |
| WO | WO9829872 | 7/1998 |
| WO | WO 00/08644 | 2/2000 |

OTHER PUBLICATIONS

Form PCT/ISA/237 for International Application No. PCT/IB2004/003761.

* cited by examiner

Rate-96/100 encoder for 8-bit ECC (2 parity bits)

Rate-96/100 decoder for 8-bit ECC (2 parity bits)

Rate-96/102 encoder for 8-bit ECC (4 parity bits)

Rate-96/102 decoder for 8-bit ECC (4 parity bits)

Phase 0 of rate-96/100 encoder for 10-bit ECC (2 parity bits)

Phase 1 of rate-96/100 encoder for 10-bit ECC (2 parity bits)

Phase 2 of rate-96/100 encoder for 10-bit ECC (2 parity bits)

Phase 3 of rate-96/100 encoder for 10-bit ECC (2 parity bits)

Phase 4 of rate-96/100 encoder for 10-bit ECC (2 parity bits)

Phase 0 of rate-96/100 decoder for 10-bit ECC (2 parity bits)

Phase 1 of rate-96/100 decoder for 10-bit ECC (2 parity bits)

Phase 2 of rate-96/100 decoder for 10-bit ECC (2 parity bits)

Phase 3 of rate-96/100 decoder for 10-bit ECC (2 parity bits)

Phase 4 of rate-96/100 decoder for 10-bit ECC (2 parity bits)

Phase 0 of rate-96/102 encoder for 10-bit ECC (4 parity bits)

Phase 1 of rate-96/102 encoder for 10-bit ECC (4 parity bits)

Phase 2 of rate-96/102 encoder for 10-bit ECC (4 parity bits)

Phase 3 of rate-96/102 encoder for 10-bit ECC (4 parity bits)

Phase 4 of rate-96/102 encoder for 10-bit ECC (4 parity bits)

Phase 0 of rate-96/102 decoder for 10-bit ECC (4 parity bits)

Phase 1 of rate-96/102 decoder for 10-bit ECC (4 parity bits)

Phase 2 of rate-96/102 decoder for 10-bit ECC (4 parity bits)

Phase 3 of rate-96/102 decoder for 10-bit ECC (4 parity bits)

Phase 4 of rate-96/102 decoder for 10-bit ECC (4 parity bits)

Rate-100/104 encoder (2 parity bits)

Rate-100/104 decoder (2 parity bits)

Rate-100/106 encoder (4 parity bits)

Rate-100/106 decoder (4 parity bits)

Rate-64/66 encoder (1 parity bit)

Rate-64/66 decoder (1 parity bit)

Rate-60/62 encoder (1 parity bit)

Rate-60/62 decoder (1 parity bit)

The 20/21-based modular structure of the rate-100/108 block encoder

The rate-100/108 block encoder

The 20/21-based modular structure of the rate-100/108 block decoder

The rate-100/108 block decoder

DATA STORAGE SYSTEMS

CROSS-REFERENCE TO RELATED APPLICATIONS

This application claims priority under 35 U.S.C. §120 to U.S. patent application Ser. No. 10/739,966 filed Dec. 18, 2003, now U.S. Pat. No. 7,395,482.

FIELD OF THE INVENTION

The present invention relates to data storage systems and more particularly to modulation coding techniques for use when storing data in a data storage system.

BACKGROUND

As is known in the art, when storing data in a data storage system it is common to "code" the "raw", original user data in some way so as to, for example, make the data storage more efficient, and less susceptible to errors. There are typically three types of coding that are employed when storing data on a storage medium.

Firstly, the original data would normally be compressed in some way. This is commonly referred to as source coding. The next stage is usually to encode the compressed data to provide some form of error protection. This usually involves a coding process that adds a few bytes to the data, which bytes can then be used to detect and correct errors when the data is read out. A common example of such error correction coding (ECC) is Reed-Solomon coding.

The error correction coded data is then typically subject to further encoding, which further encoding is usually referred to as "modulation coding." This coding is used to impose constraints on the data sequences written on to the storage medium (e.g., such that there can be no more than three consecutive "0"s) and is done for "house-keeping" purposes, e.g., to aid timing recovery and gain control and to shorten the detector path memory. Modulation coding can also improve performance of the storage system (an example of this is the use of (d, k) codes in magnetic and optical storage systems).

After modulation coding, the data may then be further "parity" coded, as is known in the art, to add one or more parity bits to the data. Thereafter the data can be written to the storage medium, e.g. magnetic tape or disk drive, or optical disk, and stored.

Reading the data from the storage medium and restoring the original data is the reverse process. Thus, for example, the detector output read from the storage medium is fed to a post-processor that performs soft-decision decoding of the parity-check code, a modulation decoder is then used to invert the modulation coding, and finally an error detection decoder is used to correct errors and deliver (its estimate of) the (compressed) original user data.

As is known in the art, the modulation coding step discussed above usually involves two steps. The first is so-called modulation coding that maps bits in the input data stream to a particular constrained output bit arrangement; for example a 16/17 code mapping a 16 bit input to a constrained 17 bit output data sequence. Examples of such modulation coding are constrained codes such as so-called run length limited (d, k) constrained codes, (G, I) constrained codes, and maximum transition run (j, k) constrained codes. Hereinafter, the term "modulation coding" will be used to refer to the application of this form of constrained coding, excluding any subsequent preceding step (see below).

The second step in the overall "modulation" coding process is so-called "preceding". Precoding operates on the "constrained" coded data and operates, as is known in the art, effectively to convert or translate a more simple set of constraints that are imposed on a data sequence by modulation (constrained) coding into a larger and more complex set of constraints that it is actually desired to impose on the data sequence, e.g., at the channel input. For example, with reference to the above discussed coding "constraint" of there being no more than three "0"s in succession, the use of preceding can "translate" that relatively simple constraint into the twin requirements that there can be no more than four "0"s in succession and that there can be no more than four "1"s in succession. For a given encoder and decoder structure, such as a block encoder and block decoder, preceding may allow stronger constraints to be imposed on the data sequence but without the need for a commensurate increase in the complexity of the modulation coding that is applied. Thus using preceding simplifies the modulation coding that needs to be performed. Examples of preceding techniques that are used are so-called $1/(1 \oplus D^2)$ and $1/(1 \oplus D)$ preceding, as is known in the art (where $\oplus$ indicates the Boolean logic operation XOR (exclusive OR)).

As is known in the art, the overall aim of modulation coding and preceding is to adapt the data signal to the (recording) channel that it is subsequently to be "transmitted" on. A more general discussion of coding, including modulation coding and preceding, can be found, e.g., in K. A. S. Immink, P. H. Siegel, and J. K. Wolf, "Codes for Digital Recorders", IEEE Trans. Inform. Theory, Vol. 44, pp 2260-2299, October 1998.

However, a disadvantage to the use of preceding is that it can introduce error propagation and increase errors when the stored data is read out. This is because, as is known in the art, in the inverse preceding step each single read stored bit is usually used to determine two output bits of the inverse preceding process. Thus an error in a single stored bit can result in two bit errors in the output from the inverse precoder. This can then lead to further error propagation in modulation decoding and degrade error correction performance.

SUMMARY OF THE INVENTION

The Applicants have accordingly proposed in their earlier European patent application no. 02012676.9 filed 7 Jun. 2002 a modulation encoding technique that does not use preceding, i.e. that is precoderless. As preceding is not used in this technique error propagation due to preceding is avoided. However, the benefits introduced by preceding are not further available. The Applicants believe therefore that there remains a need for improved modulation coding techniques for data storage.

Thus, according to a first aspect of the present invention, there is provided a method of encoding an input bit sequence, comprising: applying modulation coding to some or all of the input bit sequence; and preceding one or more selected portions of the input bit sequence after the modulation coding has been applied.

According to a second aspect of the present invention, there is provided an apparatus for encoding an input bit sequence, comprising: means for applying modulation coding to some or all of the input bit sequence; and means for preceding one or more selected portions of the input bit sequence after the modulation coding has been applied.

According to a third aspect of the present invention, there is provided a precoder for applying preceding to data bits received from a modulation encoder, the precoder comprising: means for selectively precoding data bits received from a modulation encoder.

The Applicants have recognized that it is possible to use precoding more selectively on a bit sequence to be encoded and that accordingly the use of precoding can be retained, but without the need to precode the entire input bit sequence. Thus, precoding can be applied to selected portions of the input bit sequence only. This reduces the amount of precoding that is applied (and accordingly the risk of error propagation due to the precoding), but does not eliminate the use of precoding altogether. Thus the present invention effectively uses selective or "local" precoding as compared to prior art systems that use precoding on all of the input stream ("global" precoding) or that use no precoding at all (are precoderless).

In general, precoding one or more selective portions of a sequence is interpreted as precoding one or more selective portions of this sequence but not all portions. This interpretation is also applicable to the corresponding reverse process and apparatus described below.

The portion or portions of the input bit sequence that is precoded can be selected as desired. In a particularly preferred embodiment, portions of the input bit sequence to which modulation coding has been applied are precoded. This is advantageous, because, as discussed above, an advantage of precoding is that it assists the modulation coding process. Thus, by precoding the portions of the input bit sequence that are modulation coded, the selective precoding of the present invention is used where it is most usefully applied. Preferably precoding is applied to all portions of the bit sequence to which modulation coding has been applied. Most preferably precoding is only applied to portions of the bit sequence to which modulation coding has been applied.

Thus, in a system where modulation coding is only applied to portions of the input bit sequence (i.e. such that after modulation coding the bit sequence contains some modulation coded bits and some bits that have not been modulation coded (i.e. that pass through the modulation coding unchanged), for example, as described in U.S. Pat. Nos. 5,604,497 and 5,784,010, incorporated herein by reference in their entirety, the precoding is preferably applied only to the modulation coded bits but not to the uncoded bits. In other words, in a particularly preferred embodiment, the criteria that governs the application of the precoding is whether at the output of the modulation encoder a bit is encoded or not, with (most preferably), encoded bits being precoded, and uncoded bits (i.e. bits that are not changed by the modulation encoder) not being precoded. This avoids the need to perform inverse precoding on unmodulation coded bits when the data is read out, thereby reducing error propagation and improving error rate performance. Thus a preferred arrangement of the present invention is a precoder that is turned on and off depending on whether it operates on random data or modulation encoded data (within a given bit sequence or block, e.g. codeword).

It is believed that such arrangements may be new and advantageous in their own right. Thus, according to a fourth aspect of the present invention, there is provided a method of encoding a bit sequence, comprising: applying modulation coding to a selected portion or portions of the input bit sequence; and applying precoding to the data bits encoded by the modulation coding, but not precoding any data bits that are not modulation coded.

According to a fifth aspect of the present invention, there is provided an apparatus for encoding a bit sequence, comprising: means for applying modulation coding to a selected portion or portions of the bit sequence; and means for applying precoding to the data bits encoded by the modulation coding, but not precoding any data bits that are not modulation coded.

According to a sixth aspect of the present invention, there is provided a precoder for applying precoding to data bits received from a modulation encoder, the precoder comprising: means for selectively precoding data bits received from a modulation encoder on the basis of whether or not the received data bits have been modulation coded by the modulation encoder.

Modulation coding one or more selective portions of a sequence is interpreted as modulation coding one or more selective portions of this sequence but not all portions. This interpretation is also applicable to the corresponding reverse process and apparatus described below.

The precoding can be carried out in any suitable manner, such as by using the existing $1/(1 \oplus D)$ or $1/(1 \oplus D^2)$ precoding schemes. As will be appreciated by those skilled in the art, the actual precoding scheme to use can, for example, depend on the modulation coding technique being used. The precoder will typically be implemented as a linear circuit that has memory.

The modulation coding that is used in the present invention can be any suitable form of such coding, i.e. that constrains the input data. Thus, for example, known (d, k), (G, I), and MTR (j, k) codes could be used. The modulation coding could be applied to all the bits in the input bit sequence, or only to selected bits (i.e. portions, e.g. bytes) in the input bit sequence (as described, e.g., in U.S. Pat. Nos. 5,604,497 and 5,784,010). In a particularly preferred embodiment the modulation coding is applied to selected portions of the input bit sequence (e.g. block or codeword) only.

The output of the modulation encoding could be provided to the selective precoding stage as it is output from the modulation encoder, e.g. in a linear fashion. However, in a particularly preferred embodiment the positions of the bits output from the modulation encoding stage in the data sequence are changed. Most preferably the modulation coded bits are distributed through the data sequence, most preferably to space them more equally in a given block of the data sequence (for example, so as to make the maximum gap in the bit sequence between modulation coded groups of bits smaller (and/or, e.g., to make the gaps more equal) than if the modulation coded bits were not redistributed).

Thus, in a preferred embodiment, the output from the modulation coding stage is permuted (i.e. the order of the bits is mixed up; bit positions in the input data sequence are interchanged) before the precoding is applied. Such permutation could be arranged, e.g., to equally space bits or blocks of bits that are adjacent in the original input data sequence.

An advantage of distributing or permuting the modulation coded data bits prior to precoding is that such distribution (e.g. permutation) has been found to further aid timing recovery requirements, etc. Thus, for example, in an arrangement where only selected portions of the input bit sequence are modulation coded, in a particularly preferred embodiment of the present invention the modulation coded portions of the bit sequence are divided into plural (smaller) pieces, which pieces are then moved in position in the bit sequence so as to, e.g., space them apart and/or reorder them, i.e. such that the "pieces" of coded data are dispersed amongst the uncoded (unmodulation coded) bits also output after the modulation coding step. The precoding stage would then preferably selectively precode the modulation coded bits in the "permuted" bit sequence.

The Applicants have further recognized that moving (changing) the positions of the bits output after modulation encoding in the data sequence prior to preceding makes it possible (by appropriate selection of the bit distribution pattern) to place, e.g., given parts of the modulation coded data sequence at particular, desired locations in the data sequence. In particular, for example, the modulation coded bits can effectively be placed at the same positions in the bit sequence as seen by the precoder, irrespective, e.g., of the error correction coding and modulation coding scheme being used.

Thus, for example, by using an appropriate modulation coded bit distribution or permutation scheme, the same, unchanged, so-called "inner channel" (i.e. precoder, write/read stages, detector, and inverse precoder) arrangement can be used with different outer, error correction coding processes (i.e. such that the "inner channel" does not need to be changed to be able to operate with different outer, error correction coding processes). Thus, for example, where Reed-Solomon coding is used, the use of "permutation" as discussed above can allow the same "inner channel" (and modulation coding scheme) to be used for different Reed-Solomon code symbol sizes.

This is particularly advantageous, because although today outer Reed-Solomon error correction codes are usually based on 8-bit symbols, there is a move to the use of 10 bit Reed-Solomon symbols (as that offers a performance gain of about 0.3 dB). It would be desirable therefore to provide a system that can operate with either 8-bit or 10-bit Reed-Solomon codes. The present invention facilitates this by "permuting" the output of the modulation coding, which allows the same "inner channel" to be used with the two different Reed-Solomon symbol sizes.

Although it may already be known to reorder or permute the output of a modulation encoder in data storage systems, the Applicants believe that the idea of carrying out such reordering or permutation with reference to the "outer" or error correction codes to be employed may be new and advantageous in its own right. Thus, according to a seventh aspect of the present invention, there is provided a method of encoding a data sequence for storage, comprising: error correction coding the data sequence; modulation encoding all or part of the error correction coded data sequence; and changing the positions of modulation coded bits in the data sequence after the modulation encoding step on the basis of the error correction code used to error correction code the data sequence.

According to an eighth aspect of the present invention, there is provided an apparatus for encoding a data sequence for storage, comprising: means for error correction coding the data sequence; means for modulation encoding all or part of the error correction coded data sequence; and means for changing the positions of modulation coded bits in the data sequence after the modulation encoding step on the basis of the error correction code used to error correction code the data sequence.

According to a ninth aspect of the present invention, there is provided a method of encoding a data sequence for storage, comprising: error correction coding the data sequence; modulation encoding all or part of the error correction coded data sequence; and changing the positions of modulation coded bits in the data sequence after the modulation encoding step on the basis of the preceding to be used to precode the data sequence.

According to a tenth aspect of the present invention, there is provided an apparatus for encoding a data sequence for storage, comprising: means for error correction coding the data sequence; means for modulation encoding all or part of the error correction coded data sequence; and means for changing the positions of modulation coded bits in the data sequence after the modulation encoding step on the basis of the preceding to be used to precode the data sequence.

In these aspects of the invention, the modulation coded bit sequence is reordered (permuted) after the modulation coding stage, with the (permutation) scheme used being selected in accordance with the error correction coding scheme (e.g. Reed-Solomon coding symbol size) or "inner channel" (e.g. preceding scheme) being used. (As will be appreciated by those skilled in the art, the modulation coding scheme will also typically be selected on the basis of the error correction code used to error correction code the data sequence.)

These aspects and embodiments of the invention can include any one or more or all of the preferred and optional features of the invention described herein. Thus they preferably include, e.g., a further step of selective or local preceding of the data after the "permutation" has taken place. It would also be possible to use this technique in a precoderless system, if desired.

As well as the modulation coding and selective preceding steps, the present invention can include any one or more of the other processes typically employed when coding data for storage, such as, for example, applying error correction coding (such as a Reed-Solomon code) prior to the modulation coding, and parity coding the data bits after the local preceding step (i.e. just before the data is written to the storage medium).

The present invention is also applicable to the reverse process of reading data from the storage medium, and then removing the coding to restore the original user data. In such a process, the inverse preceding would accordingly be applied only where the preceding had been applied when the data was stored.

Thus, according to an eleventh aspect of the present invention, there is provided a method of decoding a bit sequence read from a storage medium, comprising: inverse preceding one or more selected portions of the read bit sequence; and applying modulation decoding to some or all of the read bit sequence after the inverse preceding coding has been applied.

According to a twelfth aspect of the present invention, there is provided an apparatus for decoding a bit sequence read from a storage medium, comprising: means for inverse preceding one or more selected portions of the read bit sequence; and means for applying modulation decoding to some or all of the read bit sequence after the inverse preceding has been applied.

According to a thirteenth aspect of the present invention, there is provided an inverse precoder for applying inverse preceding to data bits read from a storage medium, the inverse precoder comprising: means for selectively inverse preceding data bits read from the storage medium.

According to a fourteenth aspect of the present invention, there is provided a method of decoding a bit sequence read from a storage medium, comprising: applying inverse preceding to read data bits that have been encoded by modulation coding, but not inverse preceding any data bits that are not modulation coded; and applying modulation decoding to the portion or portions of the read bit sequence that have been modulation encoded.

According to a fifteenth aspect of the present invention, there is provided an apparatus for decoding a bit sequence read from a storage medium, comprising: means for applying inverse preceding to read data bits that have been encoded by modulation coding, but not inverse preceding any data bits that are not modulation coded; and means for applying modulation decoding to the portion or portions of the read bit sequence that have been modulation encoded.

According to a sixteenth aspect of the present invention, there is provided an inverse precoder for applying inverse precoding to data bits read from a storage medium, the inverse precoder comprising: means for selectively inverse precoding data bits read from the storage medium on the basis of whether or not the read data bits have been modulation coded by a modulation encoder.

According to a seventeenth aspect of the present invention, there is provided a method of decoding a data sequence read from a storage medium, comprising: changing the positions of bits in the read data sequence; modulation decoding all or part of the reordered data sequence; and error correction decoding the data sequence after the modulation decoding step; wherein the changing of the positions of bits in the read data sequence is based on the error correction code used to error correction code the data sequence.

According to an eighteenth aspect of the present invention, there is provided an apparatus for decoding a data sequence read from a storage medium, comprising: means for changing the positions of bits in the read data sequence; means for modulation decoding all or part of the reordered data sequence; and means for error correction decoding the data sequence after the modulation decoding step; wherein the changing of the positions of bits in the read data sequence is based on the error correction code used to error correction code the data sequence.

According to a nineteenth aspect of the present invention, there is provided a method of decoding a data sequence read from a storage medium, comprising: changing the positions of bits in the read data sequence; modulation decoding all or part of the reordered data sequence; and error correction decoding the data sequence after the modulation decoding step; wherein the changing of the positions of bits in the read data sequence is based on the inverse precoding to be used to inverse precode the data sequence.

According to a twentieth aspect of the present invention, there is provided an apparatus for decoding a data sequence read from a storage medium, comprising: means for changing the positions of bits in the read data sequence; means for modulation decoding all or part of the reordered data sequence; and means for error correction decoding the data sequence after the modulation decoding step; wherein the changing of the positions of bits in the read data sequence is based on the inverse precoding to be used to inverse precode the data sequence.

These aspects and embodiments of the invention can, as will be appreciated by those skilled in the art, include any one or more or all of the above preferred and optional features of the invention as appropriate (e.g. in an appropriate "inverse" form to their application in the encoding process).

The present invention is applicable to storage devices and systems and software, and data recording methods and codes in general. It is particularly, but not exclusively, applicable to magnetic storage systems such as magnetic tape drives and hard disk drives. It can also, e.g., be used in optical data storage systems. It will accordingly find particular application in server, desktop, and mobile drives.

The present invention can be used in and for any appropriate data storage system. As will be appreciated by those skilled in the art, in such use, in the preferred embodiments of the invention at least the input user data to be stored will first typically be compressed or source coded in some way, and then divided into regular sized portions or codewords, with some form of error correction coding (such as Reed-Solomon coding) then being applied. The next stage would then be to apply modulation (constrained) coding to all or part of the error correction coded bit sequence. The bit sequence can then be permuted (as discussed above) if desired, and then "local" precoding would be applied to selected portions of the bit sequence (preferably only those portions that have been modulation coded). Finally, a small number of parity bits may be added before the data is written to the storage medium for storage. (As will be appreciated by those skilled in the art, the order of the above steps can be varied if desired (and one or more of the steps may be omitted). For example, it is known to apply some form of modulation coding prior to the error correction coding stage in some systems.) Reading the data from the storage medium and restoring the original user data is the reverse process.

The present invention also extends to data sequences prepared and stored in accordance with the present invention. Thus, according to a twenty-first aspect of the present invention, there is provided an error correction coded data sequence in which one or more portions of the data sequence have been modulation coded and in which one or more but not all portions of the data sequence have been subject to precoding.

Again, this data sequence can include any one or more or all of the preferred and optional features of the invention discussed herein. Thus, for example it preferably further includes one or more parity bits, and, preferably the modulation coded portion or portions are permuted over the data sequence (i.e. divided into smaller pieces that are then separated in the data sequence).

The present invention also extends to data storage systems including or using any of the above apparatus and methods of the present invention and/or storing data sequences in accordance with the present invention.

The methods in accordance with the present invention may be implemented at least partially using software e.g. computer programs. It will thus be seen that when viewed from further aspects the present invention provides computer software specifically adapted to carry out the methods hereinabove described when installed on data processing means, and a computer program element comprising computer software code portions for performing the methods hereinabove described when the program element is run on data processing means. The invention also extends to a computer software carrier comprising such software which when used to operate a data encoding and/or decoding system or a data storage system comprising data processing means causes in conjunction with said data processing means said system to carry out the steps of the method of the present invention. Such a computer software carrier could be a physical storage medium such as a ROM chip, CD ROM or disk, or could be a signal such as an electronic signal over wires, an optical signal or a radio signal such as to a satellite or the like.

It will further be appreciated that not all steps of the method of the invention need be carried out by computer software and thus from a further broad aspect the present invention provides computer software and such software installed on a computer software carrier for carrying out at least one of the steps of the methods set out hereinabove.

The present invention may accordingly suitably be embodied as a computer program product for use with a computer system. Such an implementation may comprise a series of computer readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

BRIEF DESCRIPTION OF THE DRAWINGS

A number of preferred embodiments of the present invention will now be described by way of example only and with reference to the accompanying drawings, in which.

DETAILED DESCRIPTION OF THE INVENTION

Figure 1:
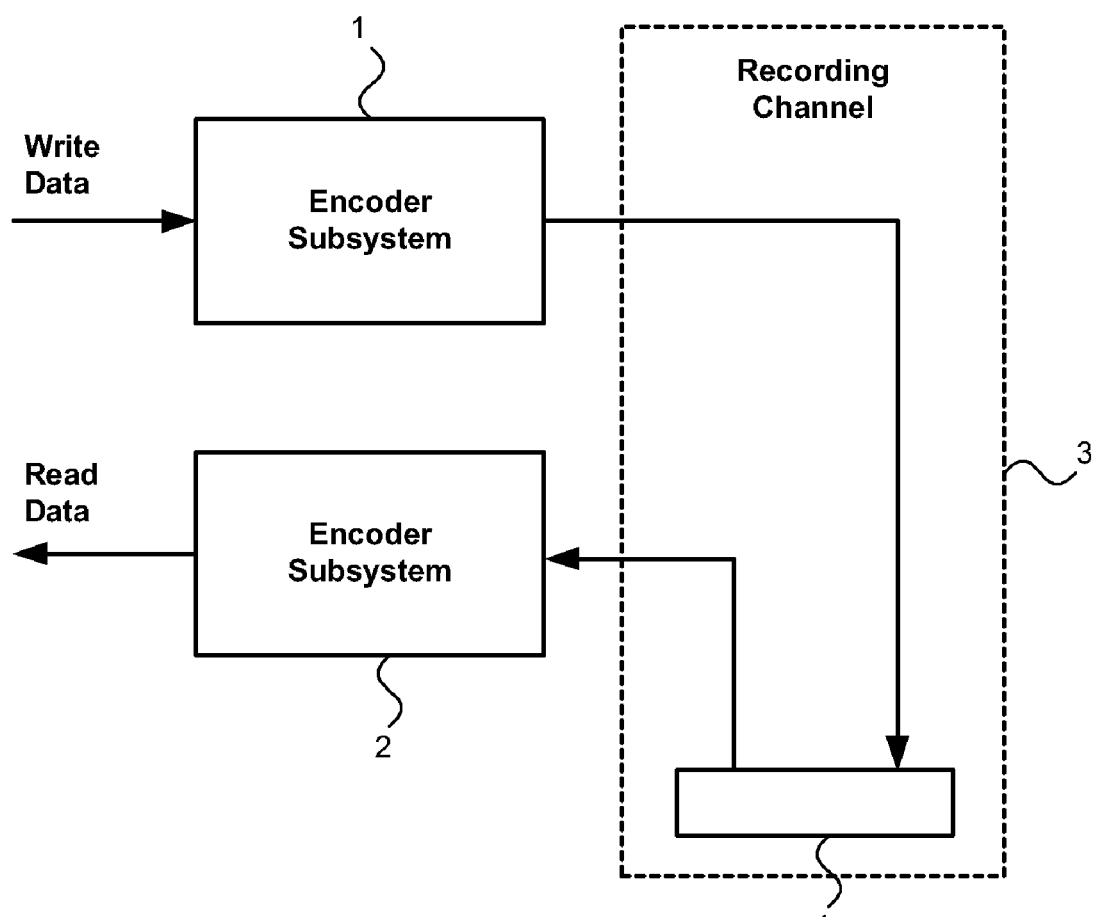
FIG. 1 shows schematically a data storage system.

FIG. 1 is a schematic diagram of a data storage system of a type that the present invention can be applied to. The data storage system comprises an encoder subsystem 1 for encoding input write data to be written onto a storage medium 4 (which may, e.g., be in the form of a hard disk drive, a magnetic tape drive or an optical disk, etc.) of a recording channel 3, and a decoder subsystem 2 for decoding the signal detected from the recording channel 3 to produce read data (that should replicate the original, user write data). This data storage system can be implemented as desired. For example, the encoder subsystem 1 and the decoder subsystem 2 could be implemented as a single application specific integrated circuit (ASIC).

Figure 2:
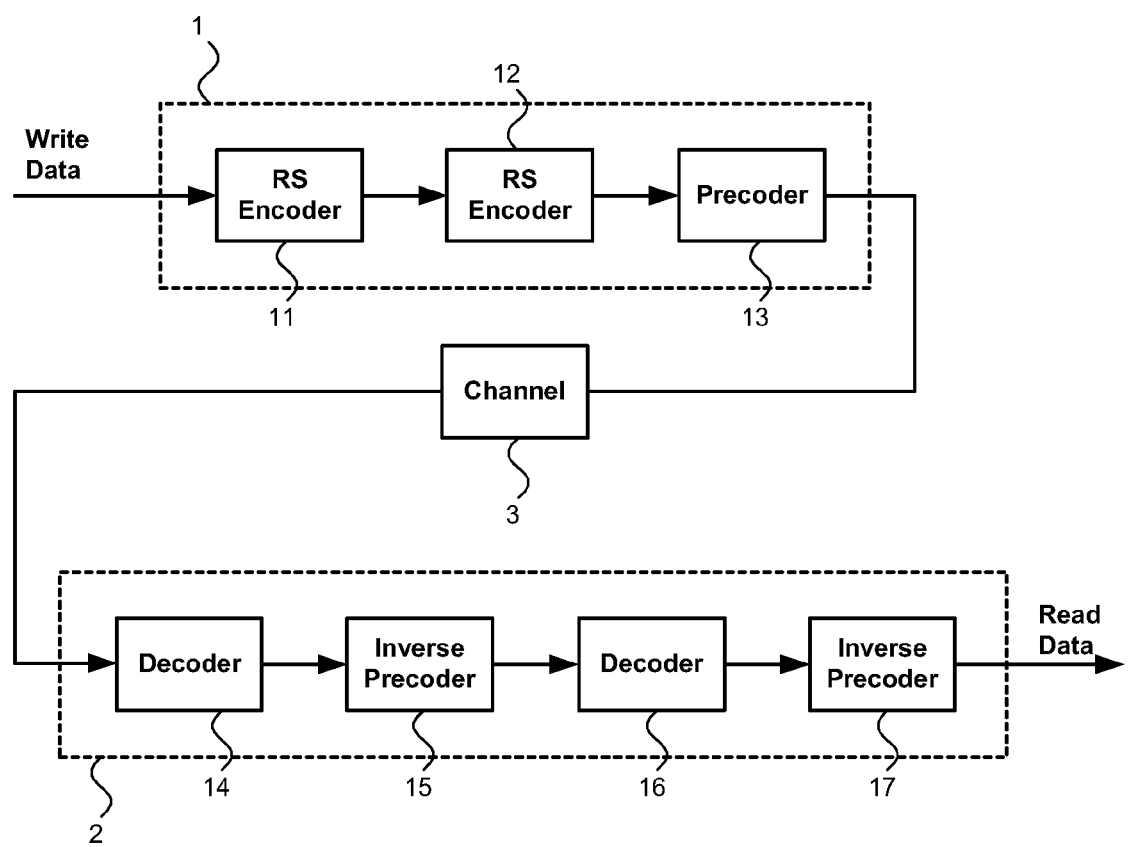
FIG. 2 shows schematically an embodiment of a data storage system in accordance with the present invention.

FIG. 2 shows schematically a preferred embodiment of a data storage system of the type shown in FIG. 1 that is in accordance with the present invention. In the embodiment shown in FIG. 2, the encoder subsystem 1 comprises an error correction code encoder 11 (in the form, in this example, of a Reed-Solomon (RS) encoder), a modulation encoder 12, and a precoder 13. The decoder subsystem 2 similarly comprises a detector 14, an inverse precoder 15, a channel decoder 16, and an error correction code decoder 17 (correspondingly in the form of a Reed-Solomon (RS) decoder).

In this embodiment, the error correction encoder 11 applies an error correction code to the incoming user bit stream, and, e.g., converts the incoming user bit stream into a sequence of symbols, such as 8-bit bytes. In the present embodiment, a Reed-Solomon error correction code is used, although other error correction codes would be possible.

The modulation encoder 12 applies so-called modulation or constrained coding to the error correction coded bit stream. This modulation encoding could comprise, e.g., (d, k), (G, I), or MTR(j, k) coding. As will be explained further below, in the present embodiments, the modulation coding is applied to selected portions of the bit stream only.

The precoder 13 applies so-called precoding to the modulation encoded bit stream. Such precoding, converts transitions in the output of the modulation encoder 12 into levels suitable for recording in the recording channel 3. As discussed above, and as will be discussed further below, this precoding is applied to selected portions of the bit stream only. The precoding could comprise, e.g., $1/(1 \oplus D)$ or $1/(1 \oplus D^2)$ precoding.

In these embodiments of the present invention, as will be explained further below, there is a further permutation step where the bit sequence is permuted after the modulation encoder 12 before precoding is applied by the precoder 13. (This is not shown in FIG. 2). It is also preferred to add one or more parity bits to the bit sequence before it is written to the storage medium 4 (again this is not shown in FIG. 2).

The decoder subsystem 2 operates in the inverse manner. Thus the detector 14 receives stored data from the recording channel 3, the inverse precoder 15 removes the precoding, the permutation of the bit stream is then reversed (not shown), the modulation decoder 16 removes the modulation coding to provide the symbols that are then converted into an output user bit stream by the error correction code decoder 17.

In a system such as that shown in FIG. 2, the "channel" 3 that is shown schematically as appearing between the precoder 13 and detector 14 effectively includes steps of or a chain of signal processing functions that include, e.g., write precompensation, write processing onto the, e.g., magnetic storage device, reading the (magnetic) signal from the storage device, various amplifying and filtering stages of the read signal, an analog-to-digital conversion, equalization, and digital filtering, etc. The detector 14 then attempts to produce its best estimate of the bits as they appeared at the input to the channel 3 (i.e. to "undo" the effects of the channel 3 and reproduce the output of the precoder 13) for providing to the inverse precoder 15.

Figure 3:
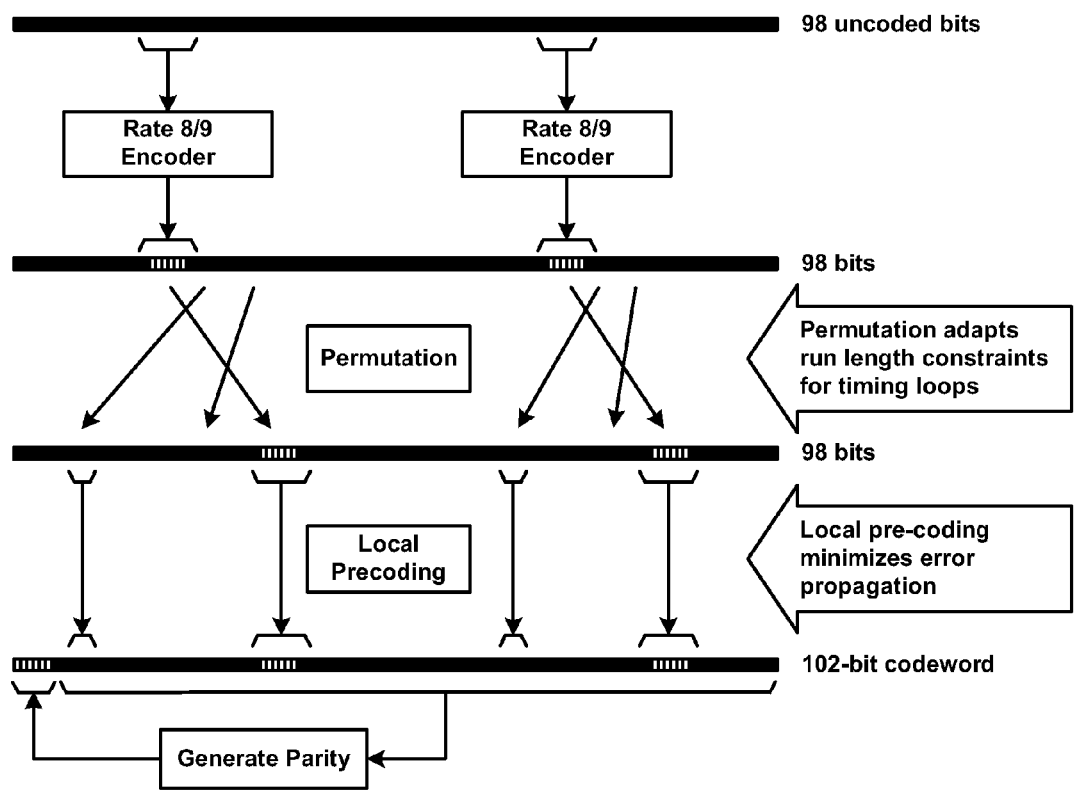
FIG. 3 shows schematically the data encoding process of an embodiment of the present invention.

FIG. 3 shows schematically the modulation coding, permutation and selective (local) precoding steps of preferred embodiments of the present invention. As shown in FIG. 3, an example initial 96 bit block of data (that has already been error correction coded) is first subject to (in this embodiment) rate 8/9 modulation encoding. This modulation encoding is applied to, as shown in FIG. 3, 2 bytes (8-bit portions) in the 96 bit block only. The remaining bits in the initial data block are left unchanged after the modulation coding step.

There is then a permutation step where the modulation encoded data portions (now 9 bits long) and an adjacent portion of the unmodulation coded bit sequence are divided into smaller portions which are then separated and dispersed over the overall bit block as shown in FIG. 3. In this embodiment, the permutation uses three smaller data portions and moves and reorders them as shown, although other arrangements would, of course, be possible.

This permutation step is used in particular to adapt the run length constraints of the coded data for the system's timing loops. In particular, as can be seen from FIG. 3, after the permutation step the modulation coded bits are divided and spread apart (distributed) more evenly in the bit sequence. As the modulation coded bits are "constrained" this redistribution of these bits means that the spread of uncoded (and thereby unconstrained) bits between portions of coded bits is smaller (than would be the case without permutation), i.e. the constrained bits are distributed more evenly throughout the bit sequence. This aids timing recovery.

The permuting step can also be used to place the modulation coded bits at desired points in the data sequence as seen by the precoding stage. This means in particular that where, for example, different given error correction coding and modulation coding schemes will produce modulation coded bits at different positions in the bit sequence, permutation as shown in FIG. 3 can be used to always position the modulation coded bits in the same positions in the bit sequence as seen by the precoding stage, irrespective of the error correction coding and modulation coding schemes being used. This would allow, e.g., the same precoder, etc., to be used with different error correction coding and modulation coding schemes.

After the data sequence has been permuted, precoding is applied but only to selected portions of the data block (and in particular to those portions of the data block that include the (now-permuted) modulation encoded bits), as shown in FIG. 3. As discussed above, this selective precoding helps to reduce error propagation. Finally, as shown in FIG. 3, four parity bits are generated to provide a 102 bit codeword for storage from the initial 96-bit error correction coded codeword.

A number of preferred embodiments of suitable data encoding and decoding schemes that operate in accordance with the present invention will now be described with reference to FIGS. 4 to 35. These embodiments are designed for use with 8-bit or 10-bit error correction codes (Reed-Solomon codes) and use the same rate 8/9 modulation code for modulation coding (as will be explained further below).

In the following embodiments, the following logic conventions will be used. For all binary numbers or groups of bits or group of bytes, the Least Significant Bit (LSB) is always "index 0" with increasing indices up to the Most Significant Bit (MSB). MSB is always shown to the left and LSB is always shown to the right. When data is written onto the storage medium, the information (bytes, words, blocks) is sent MSB first. When data is read from the storage medium, the information (bytes, words, blocks) is received MSB first.

An array a[m: 0] consists of the elements a(m), a(m−1), . . . , a(0), where a(m) is the least recent bit and a(0) is the most recent bit. Note that time increases as the index decreases. The operations "&", "⊕" are used to stand for the Boolean operations "and", "xor", respectively. For example, in these embodiments the local preceding operation (which is $1/(1 \oplus D^2)$ preceding) is specified by the equation $$d(i)=c(i)\oplus(m(i) \& d(i+2))$$

where c(i) is the bit at the input of the precoder, d(i) is the bit at the output of the precoder, and m(i) is the masking bit at index i. In other words, d(i)=c(i) (no preceding), if m(i)=0, and d(i)=c(i) ⊕ d(i+2) (preceding), if m(i)=1.

Similarly, the local inverse preceding operation is specified by the equation $$h(i)=g(i)\oplus(m(i) \& g(i+2))$$

where g(i) is the bit at the input of the inverse precoder, h(i) is the bit at the output of the inverse precoder, and m(i) is the masking bit at index i. In other words, h(i)=g(i) (no inverse preceding), if m(i)=0, and h(i)=g(i) ⊕ g(i+2) (inverse preceding), if m(i)=1.

In the following embodiments, the code rates 96/100 and 96/102 are used for an 8-bit error correction code and code rates of 96/100 and 96/102 are used for a 10-bit error correction code. Table 1 lists the properties of these new codes:

| Rate | Parity | ECC | k | j | I |
|------|--------|-----|---|---|---|
| 96/100 | 2 | 8-bit | 26 | 26 | 27 |
| 96/102 | 4 | 8-bit | 28 | 28 | 28 |
| 96/100 | 2 | 10-bit | 26 | 26 | 27 |
| 96/102 | 4 | 10-bit | 28 | 28 | 28 |

In this table, "rate" is the coding rate, "parity" is the number of parity bits, "ECC" is the Reed-Solomon error correction code symbol size, and "k", "j" and "I" are the constraints imposed by the modulation code, where "k+1" is the maximum run length at the channel input, "j" is the maximum number of consecutive transitions at the channel input, and "I" is the maximum number of consecutive zeros in the odd-numbered or even-numbered bit positions at the output of the modulation coding (whichever is the larger).

The codes in Table 1 are based on a rate-8/9 modulation code. Table 2 shows the mapping from 8-bit words to 9-bit words for this modulation code:

TABLE 2

Code table for rate 8/9 modulation code

| INPUT | OUTPUT |
|-------|--------|
| 00000000 | 001110010 |
| 00000001 | 101110010 |
| 00000010 | 001111010 |
| 00000011 | 101111010 |
| 00000100 | 010011010 |
| 00000101 | 110011010 |
| 00000110 | 011011010 |
| 00000111 | 111011010 |
| 00001000 | 001010010 |

TABLE 2-continued

Code table for rate 8/9 modulation code

| INPUT | OUTPUT |
|-------|--------|
| 00001001 | 101010010 |
| 00001010 | 001010011 |
| 00001011 | 101010011 |
| 00001100 | 001010110 |
| 00001101 | 101010110 |
| 00001110 | 001010111 |
| 00001111 | 101010111 |
| 00010000 | 001001001 |
| 00010001 | 101001001 |
| 00010010 | 001001011 |
| 00010011 | 101001011 |
| 00010100 | 001011001 |
| 00010101 | 101011001 |
| 00010110 | 001011011 |
| 00010111 | 101011011 |
| 00011000 | 010110010 |
| 00011001 | 110110010 |
| 00011010 | 011110010 |
| 00011011 | 111110010 |
| 00011100 | 010111010 |
| 00011101 | 110111010 |
| 00011110 | 011111010 |
| 00011111 | 111111010 |
| 00100000 | 001001100 |
| 00100001 | 101001100 |
| 00100010 | 001001110 |
| 00100011 | 101001110 |
| 00100100 | 001011100 |
| 00100101 | 101011100 |
| 00100110 | 001011110 |
| 00100111 | 101011110 |
| 00101000 | 001001101 |
| 00101001 | 101001101 |
| 00101010 | 001001111 |
| 00101011 | 101001111 |
| 00101100 | 001011101 |
| 00101101 | 101011101 |
| 00101110 | 001011111 |
| 00101111 | 101011111 |
| 00110000 | 001100001 |
| 00110001 | 101100001 |
| 00110010 | 001100011 |
| 00110011 | 101100011 |
| 00110100 | 001110001 |
| 00110101 | 101110001 |
| 00110110 | 001110011 |
| 00110111 | 101110011 |
| 00111000 | 001101001 |
| 00111001 | 101101001 |
| 00111010 | 001101011 |
| 00111011 | 101101011 |
| 00111100 | 001111001 |
| 00111101 | 101111001 |
| 00111110 | 001111011 |
| 00111111 | 101111011 |
| 01000000 | 010010010 |
| 01000001 | 110010010 |
| 01000010 | 011010010 |
| 01000011 | 111010010 |
| 01000100 | 010010110 |
| 01000101 | 110010110 |
| 01000110 | 011010110 |
| 01000111 | 111010110 |
| 01001000 | 010010011 |
| 01001001 | 110010011 |
| 01001010 | 011010011 |
| 01001011 | 111010011 |
| 01001100 | 010010111 |
| 01001101 | 110010111 |
| 01001110 | 011010111 |
| 01001111 | 111010111 |
| 01010000 | 010001001 |
| 01010001 | 110001001 |
| 01010010 | 010001011 |
| 01010011 | 110001011 |
| 01010100 | 010011001 |

TABLE 2-continued

Code table for rate 8/9 modulation code

| INPUT | OUTPUT |
|---|---|
| 01010101 | 110011001 |
| 01010110 | 010011011 |
| 01010111 | 110011011 |
| 01011000 | 011001001 |
| 01011001 | 111001001 |
| 01011010 | 011001011 |
| 01011011 | 111001011 |
| 01011100 | 011011001 |
| 01011101 | 111011001 |
| 01011110 | 011011011 |
| 01011111 | 111011011 |
| 01100000 | 001100100 |
| 01100001 | 101100100 |
| 01100010 | 001100110 |
| 01100011 | 101100110 |
| 01100100 | 001110100 |
| 01100101 | 101110100 |
| 01100110 | 001110110 |
| 01100111 | 101110110 |
| 01101000 | 001100101 |
| 01101001 | 101100101 |
| 01101010 | 001100111 |
| 01101011 | 101100111 |
| 01101100 | 001110101 |
| 01101101 | 101110101 |
| 01101110 | 001110111 |
| 01101111 | 101110111 |
| 01110000 | 001101100 |
| 01110001 | 101101100 |
| 01110010 | 001101110 |
| 01110011 | 101101110 |
| 01110100 | 001111100 |
| 01110101 | 101111100 |
| 01110110 | 001111110 |
| 01110111 | 101111110 |
| 01111000 | 001101101 |
| 01111001 | 101101101 |
| 01111010 | 001101111 |
| 01111011 | 101101111 |
| 01111100 | 001111101 |
| 01111101 | 101111101 |
| 01111110 | 001111111 |
| 01111111 | 101111111 |
| 10000000 | 010001100 |
| 10000001 | 110001100 |
| 10000010 | 010001110 |
| 10000011 | 110001110 |
| 10000100 | 010011100 |
| 10000101 | 110011100 |
| 10000110 | 010011110 |
| 10000111 | 110011110 |
| 10001000 | 010001101 |
| 10001001 | 110001101 |
| 10001010 | 010001111 |
| 10001011 | 110001111 |
| 10001100 | 010011101 |
| 10001101 | 110011101 |
| 10001110 | 010011111 |
| 10001111 | 110011111 |
| 10010000 | 011001100 |
| 10010001 | 111001100 |
| 10010010 | 011001110 |
| 10010011 | 111001110 |
| 10010100 | 011011100 |
| 10010101 | 111011100 |
| 10010110 | 011011110 |
| 10010111 | 111011110 |
| 10011000 | 011001101 |
| 10011001 | 111001101 |
| 10011010 | 011001111 |
| 10011011 | 111001111 |
| 10011100 | 011011101 |
| 10011101 | 111011101 |
| 10011110 | 011011111 |
| 10011111 | 111011111 |
| 10100000 | 010100001 |
| 10100001 | 110100001 |
| 10100010 | 010100011 |
| 10100011 | 110100011 |
| 10100100 | 010110001 |
| 10100101 | 110110001 |
| 10100110 | 010110011 |
| 10100111 | 110110011 |
| 10101000 | 011100001 |
| 10101001 | 111100001 |
| 10101010 | 011100011 |
| 10101011 | 111100011 |
| 10101100 | 011110001 |
| 10101101 | 111110001 |
| 10101110 | 011110011 |
| 10101111 | 111110011 |
| 10110000 | 010101001 |
| 10110001 | 110101001 |
| 10110010 | 010101011 |
| 10110011 | 110101011 |
| 10110100 | 010111001 |
| 10110101 | 110111001 |
| 10110110 | 010111011 |
| 10110111 | 110111011 |
| 10111000 | 011101001 |
| 10111001 | 111101001 |
| 10111010 | 011101011 |
| 10111011 | 111101011 |
| 10111100 | 011111001 |
| 10111101 | 111111001 |
| 10111110 | 011111011 |
| 10111111 | 111111011 |
| 11000000 | 010100100 |
| 11000001 | 110100100 |
| 11000010 | 010100110 |
| 11000011 | 110100110 |
| 11000100 | 010110100 |
| 11000101 | 110110100 |
| 11000110 | 010110110 |
| 11000111 | 110110110 |
| 11001000 | 010100101 |
| 11001001 | 110100101 |
| 11001010 | 010100111 |
| 11001011 | 110100111 |
| 11001100 | 010110101 |
| 11001101 | 110110101 |
| 11001110 | 010110111 |
| 11001111 | 110110111 |
| 11010000 | 010101100 |
| 11010001 | 110101100 |
| 11010010 | 010101110 |
| 11010011 | 110101110 |
| 11010100 | 010111100 |
| 11010101 | 110111100 |
| 11010110 | 010111110 |
| 11010111 | 110111110 |
| 11011000 | 010101101 |
| 11011001 | 110101101 |
| 11011010 | 010101111 |
| 11011011 | 110101111 |
| 11011100 | 010111101 |
| 11011101 | 110111101 |
| 11011110 | 010111111 |
| 11011111 | 110111111 |
| 11100000 | 011100100 |
| 11100001 | 111100100 |
| 11100010 | 011100110 |
| 11100011 | 111100110 |
| 11100100 | 011110100 |
| 11100101 | 111110100 |
| 11100110 | 011110110 |
| 11100111 | 111110110 |
| 11101000 | 011100101 |
| 11101001 | 111100101 |
| 11101010 | 011100111 |
| 11101011 | 111100111 |
| 11101100 | 011110101 |

TABLE 2-continued

Code table for rate 8/9 modulation code

| INPUT | OUTPUT |
|---|---|
| 11101101 | 111110101 |
| 11101110 | 011110111 |
| 11101111 | 111110111 |
| 11110000 | 011101100 |
| 11110001 | 111101100 |
| 11110010 | 011101110 |
| 11110011 | 111101110 |
| 11110100 | 011111100 |
| 11110101 | 111111100 |
| 11110110 | 011111110 |
| 11110111 | 111111110 |
| 11111000 | 011101101 |
| 11111001 | 111101101 |
| 11111010 | 011101111 |
| 11111011 | 111101111 |
| 11111100 | 011111101 |
| 11111101 | 111111101 |
| 11111110 | 011111111 |
| 11111111 | 111111111 |

The encoder and decoder associated with this code is a block encoder and a block decoder, respectively. The block encoder and decoder for the rate-8/9 code can be designed using Table 2. Thus, for example, all the 256 legal 9-bit output words in Table 2 should be assigned to the 8-bit input bytes, with the remaining 256 illegal 9-bit output words that do not occur in Table 2 being either always mapped into the all-zero byte or into a set of 256 bytes that are preferably selected such that the Boolean logic to implement the decoder is minimized.

Figure 4:
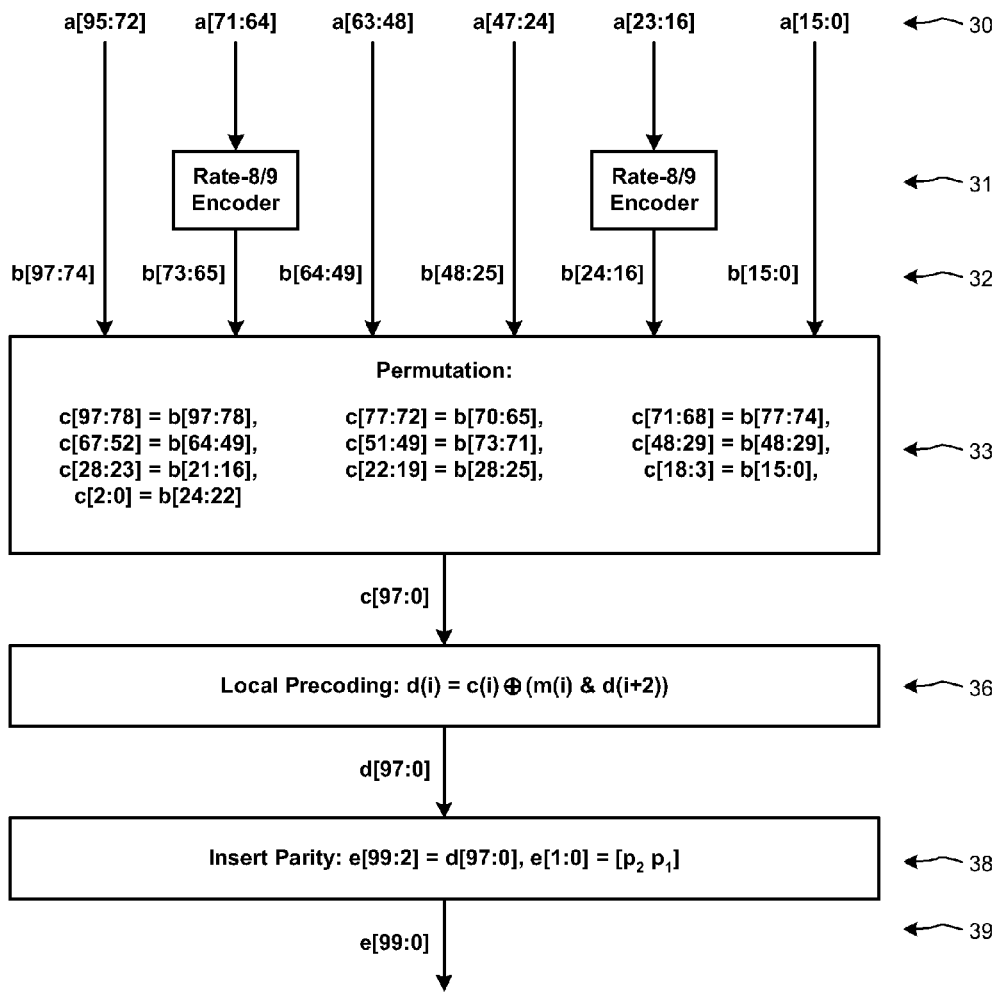
FIG. 4 shows schematically a rate 96/100 encoder for an 8-bit error correction code in accordance with a first embodiment of the present invention.

FIG. 4 shows a first embodiment of the present invention in the form of a rate-96/100 encoder for an 8-bit error correction code. The input to the modulation encoding stage, a[95:0], consists of an error correction coded data block 30 comprising twelve 8-bit bytes, B11, B10, . . . , B0. As shown in FIG. 4, in the modulation encoding stage 31, the bytes B8 and B2 are mapped (modulation coded) into respective 9-bit codewords using the rate-8/9 modulation code shown in Table 2. The remaining bytes in the data block are left unchanged by the modulation coding stage.

The so-modulation encoded bit block 32 is then permuted as shown in FIG. 4 (step 33). The encoded signal before permutation is denoted by b[97:0], whereas the encoded signal 35 after permutation is denoted by c[97:0].

After permutation, preceding is applied to selected portions of the bit block (step 36). The preceding is determined by using a "mask" to indicate the bits to be precoded as discussed above. In this embodiment, the masking bits m(i), $0 \leq i \leq 97$, needed to perform local preceding are given by m(i)=1, for i=77, 76, 75, 74, 73, 72, 51, 50, 49, 28, 27, 26, 25, 24, 23, 2, 1, 0, and m(i)=0, elsewhere. The encoded signal 37 after local preceding is denoted by d[97:0]. Finally, two parity bits are computed using the generator polynomial $1+x^2$ and inserted into the bit block (step 38). The resulting modulation/parity codeword 39 that will be written to the storage medium is e[99:0].

Figure 5:
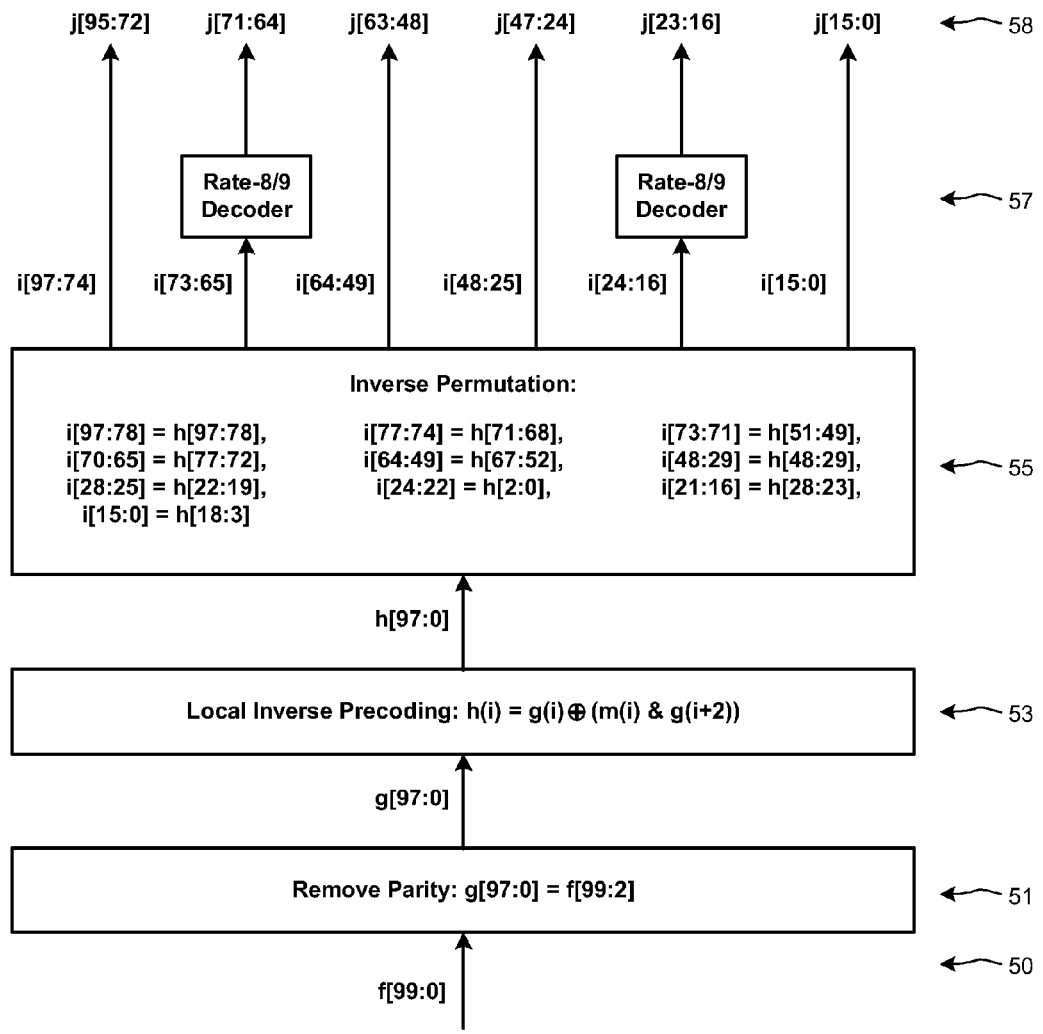
FIG. 5 shows schematically the rate 96/100 decoder that corresponds to the encoder of FIG. 3.

FIG. 5 shows the corresponding rate-96/100 decoder that can be used to recover the encoded data. The input 50 of the decoder, f[99:0], is mapped into g[97:0] after removing the parity bits (step 51). In a "perfect" system, the input f[99:0] would be the same as e[99:0] (i.e. the output of the coding process), but typically may not be, due to, e.g., errors in the read out data.

Local inverse preceding is then performed (step 53) to obtain the array h[97:0], using same masking bits m(i), $0 \leq i \leq 97$, m(i)=1, for i=77, 76, 75, 74, 73, 72, 51, 50, 49, 28, 27, 26, 25, 24, 23, 2, 1, 0, and m(i)=0, elsewhere, as for the preceding. The data block is then subjected to inverse permutation (step 55), after which the array i[97:0] is obtained.

The appropriate two bytes of codeword i[97:0] are then subjected to modulation decoding using the rate-8/9 code of Table 2 (step 57) to give the output 58 of the rate-96/100 decoder being the array j[95:0], for input to the error correction decoding stage (not shown).

The constraints in the stored data codeword e[99:0] that would be relevant to an implementation of a 16-state time-varying detector trellis are j=2 at positions 51 and 2, j=3 at positions 77, 74, 28 and 25, k=2 at positions 51 and 2, k=3 at positions 77, 74, 28 and 25.

Figure 6:
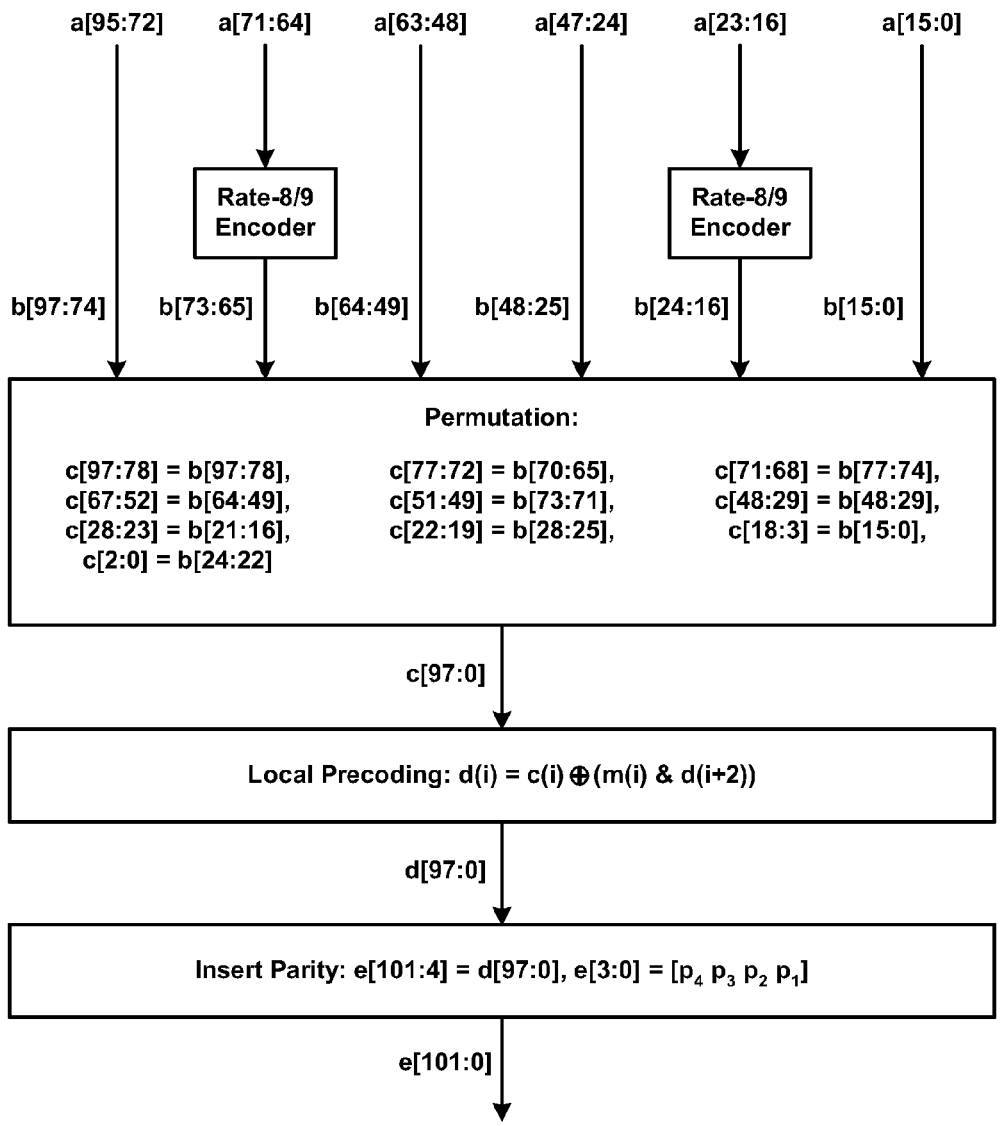
FIG. 6 shows schematically a rate 96/102 encoder for an 8 bit error correction code in accordance with a second embodiment of the present invention.

FIG. 6 shows another preferred embodiment in the form of a rate-96/102 encoder for an 8-bit error correction code. This encoder is basically the same as that shown in FIG. 4, save that four, rather than two, parity bits are used.

Thus, the input of the encoder after error correction coding, a[95:0], again consists of twelve 8-bit bytes, B11, B10, . . . , B0. The bytes B8 and B2 are again modulation coded to map them into 9-bit codewords using the rate-8/9 modulation code in Table 2. The remaining bytes remain unchanged. The so-encoded signal b[97:0] is then permuted as shown in FIG. 6 to give the signal c[97:0].

The permuted signal is then subjected to selective preceding using the masking bits m(i), $0 \leq i \leq 97$, m(i)=1, for i=77, 76, 75, 74, 73, 72, 51, 50, 49, 28, 27, 26, 25, 24, 23, 2, 1, 0, and m(i)=0, elsewhere. The encoded signal after this local preceding is again denoted by d[97:0]. Finally, four parity bits that are computed using the generator polynomial $1+x+x^4$ are inserted. The resulting modulation/parity codeword for storage on the storage medium is e[101:0].

Figure 7:
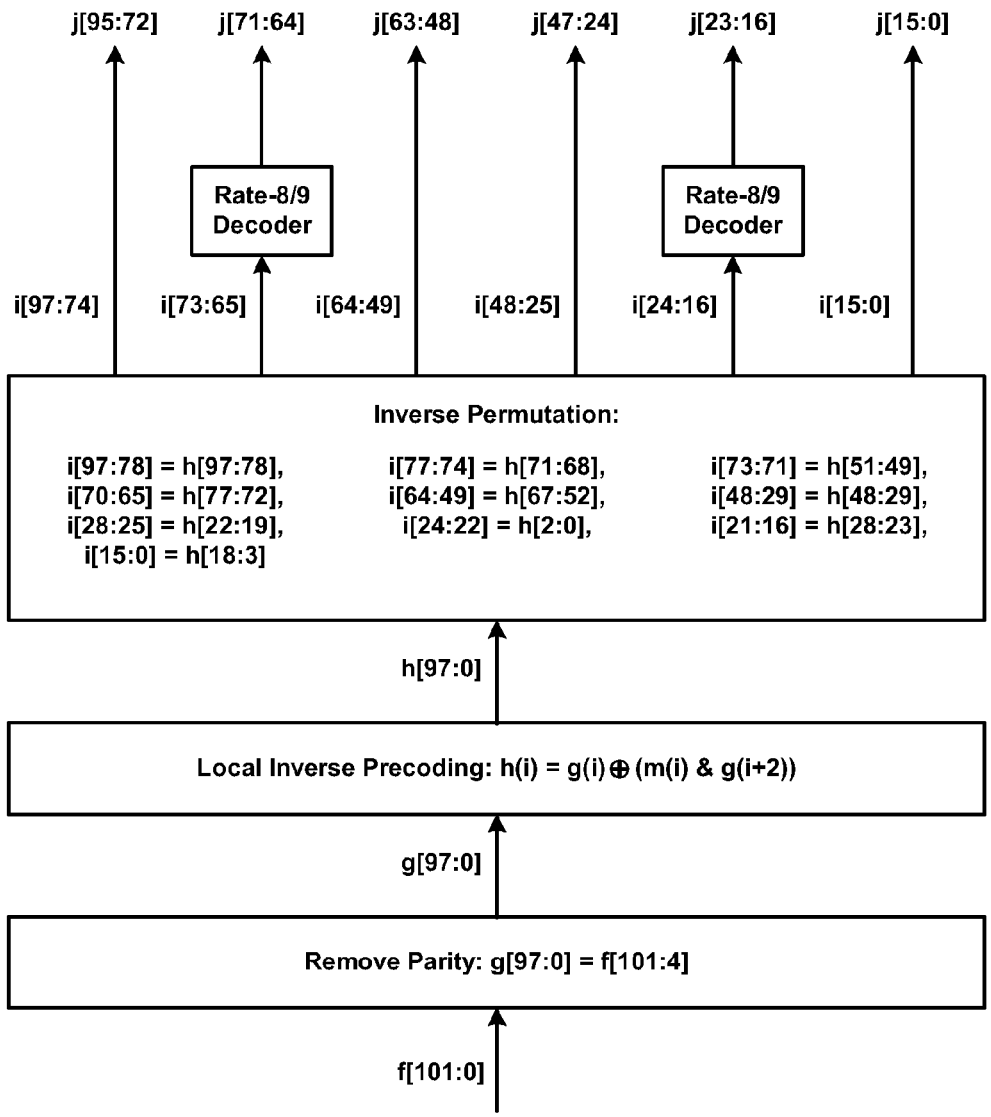
FIG. 7 shows schematically the rate 96/102 decoder that corresponds to the encoder of FIG. 6.
Figure 8:
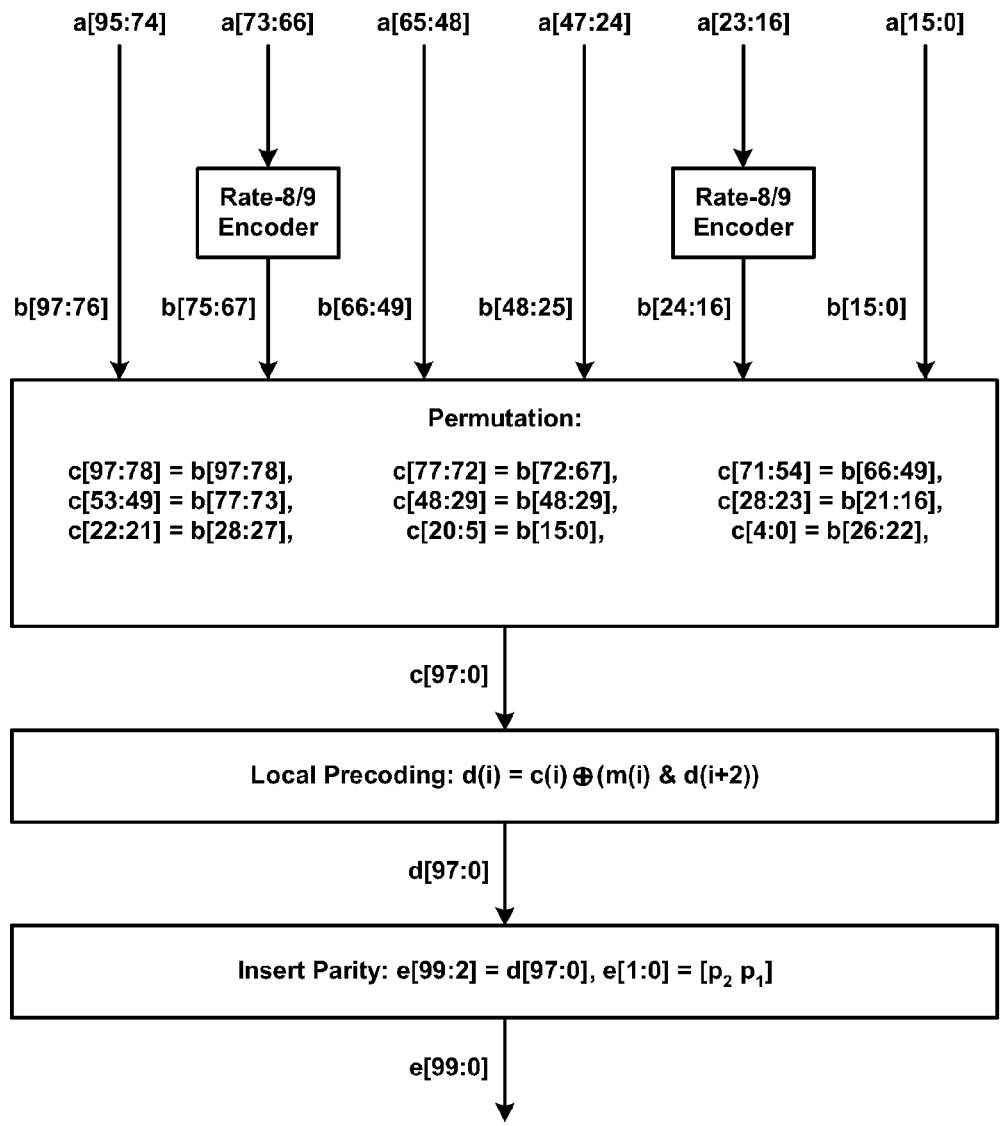
FIG. 8 shows schematically Phase 0 of a rate 96/100 encoder for a 10 bit error correction code (2 parity bits) in accordance with a third embodiment of the present invention.
Figure 9:
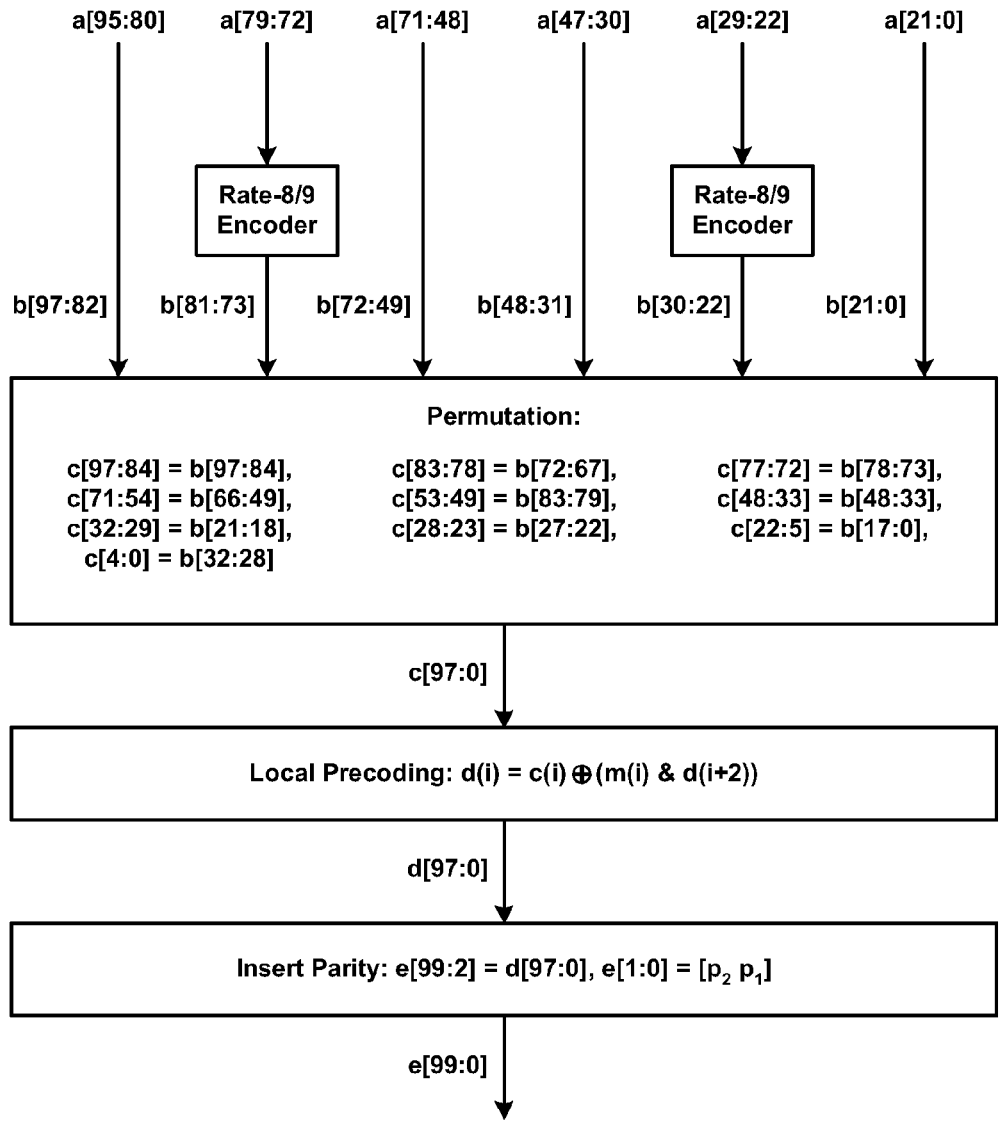
FIG. 9 shows schematically Phase 1 of a rate 96/100 encoder for a 10 bit error correction code (2 parity bits) in accordance with a third embodiment of the present invention.
Figure 10:
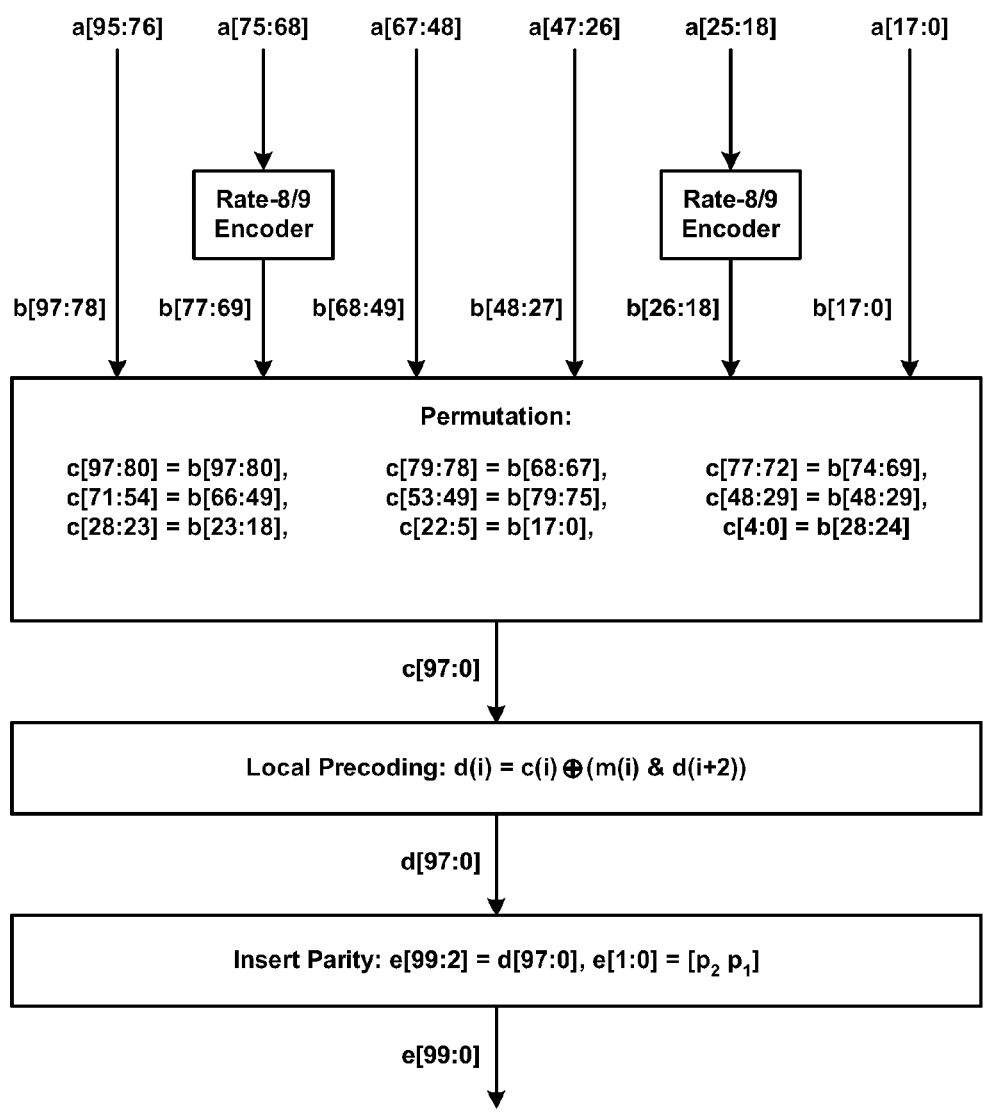
FIG. 10 shows schematically Phase 2 of a rate 96/100 encoder for a 10 bit error correction code (2 parity bits) in accordance with a third embodiment of the present invention.
Figure 11:
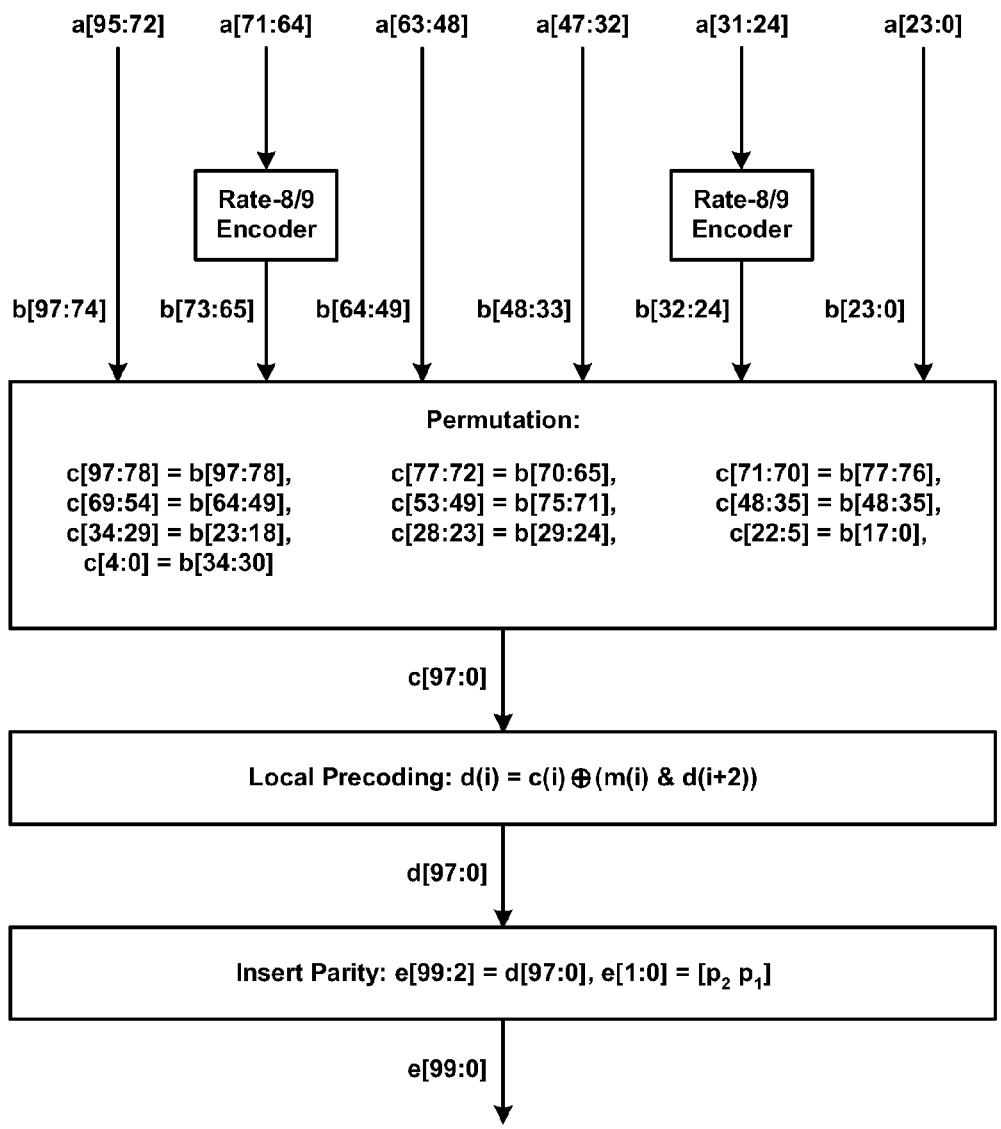
FIG. 11 shows schematically Phase 3 of a rate 96/100 encoder for a 10 bit error correction code (2 parity bits) in accordance with a third embodiment of the present invention.
Figure 12:
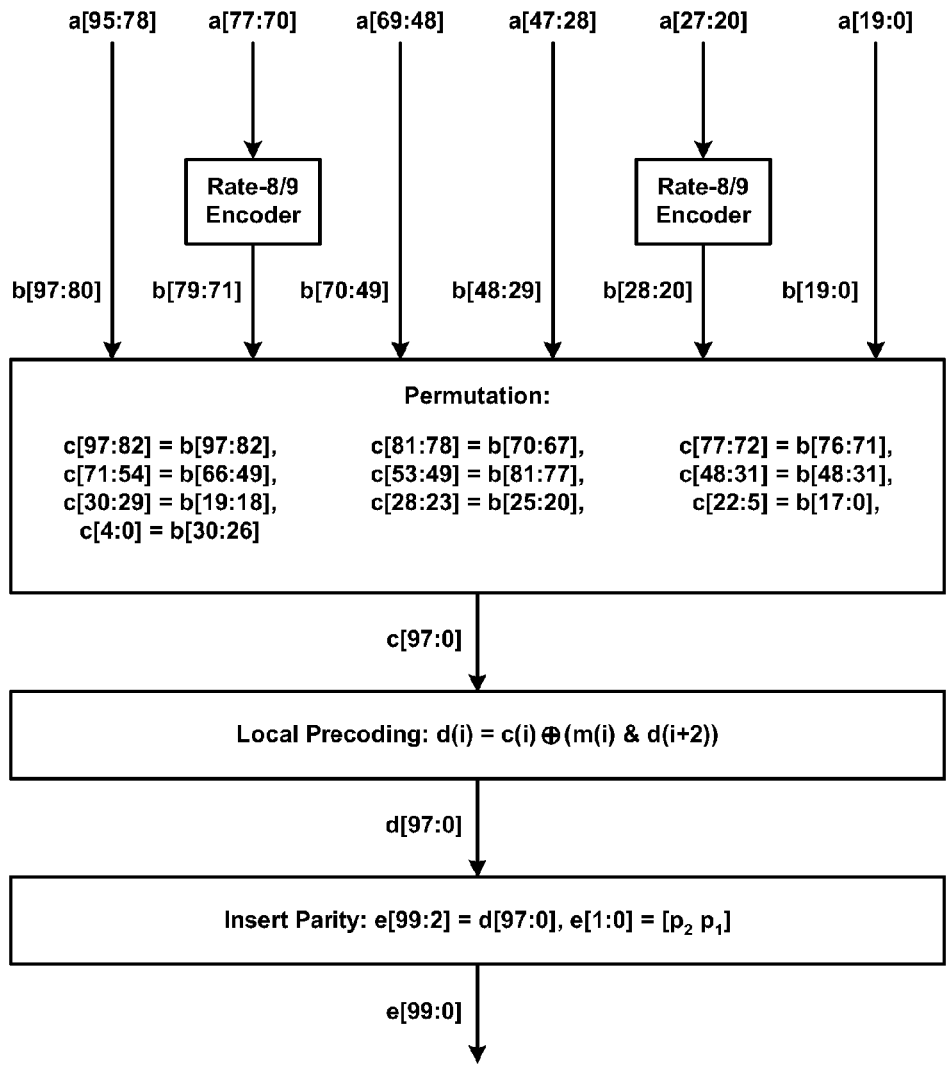
FIG. 12 shows schematically Phase 4 of a rate 96/100 encoder for a 10 bit error correction code (2 parity bits) in accordance with a third embodiment of the present invention.
Figure 13:
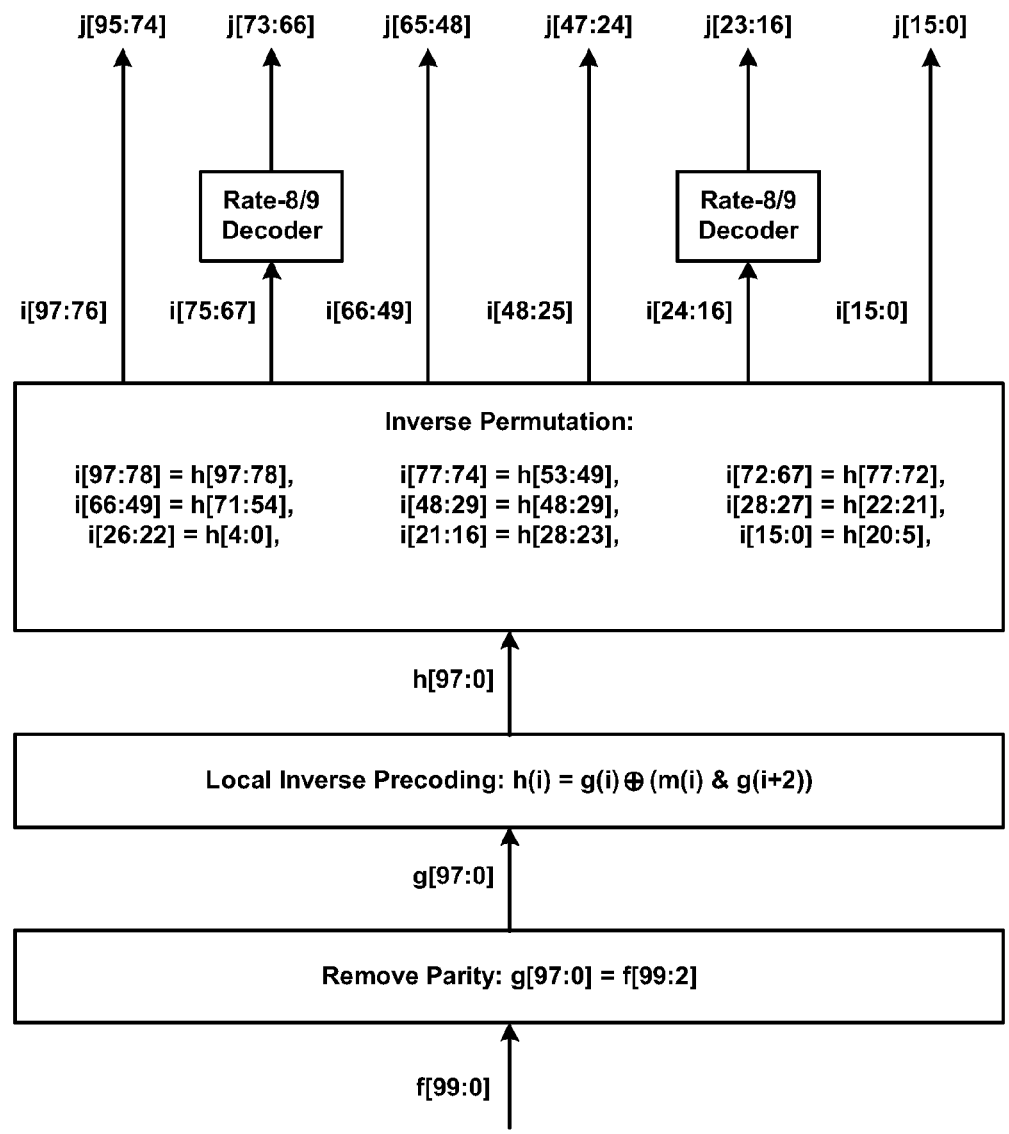
FIG. 13 shows schematically Phase 0 of the rate 96/100 decoder for a 10 bit error correction code (2 parity bits) corresponding to the encoder of FIGS. 7 to 11.
Figure 14:
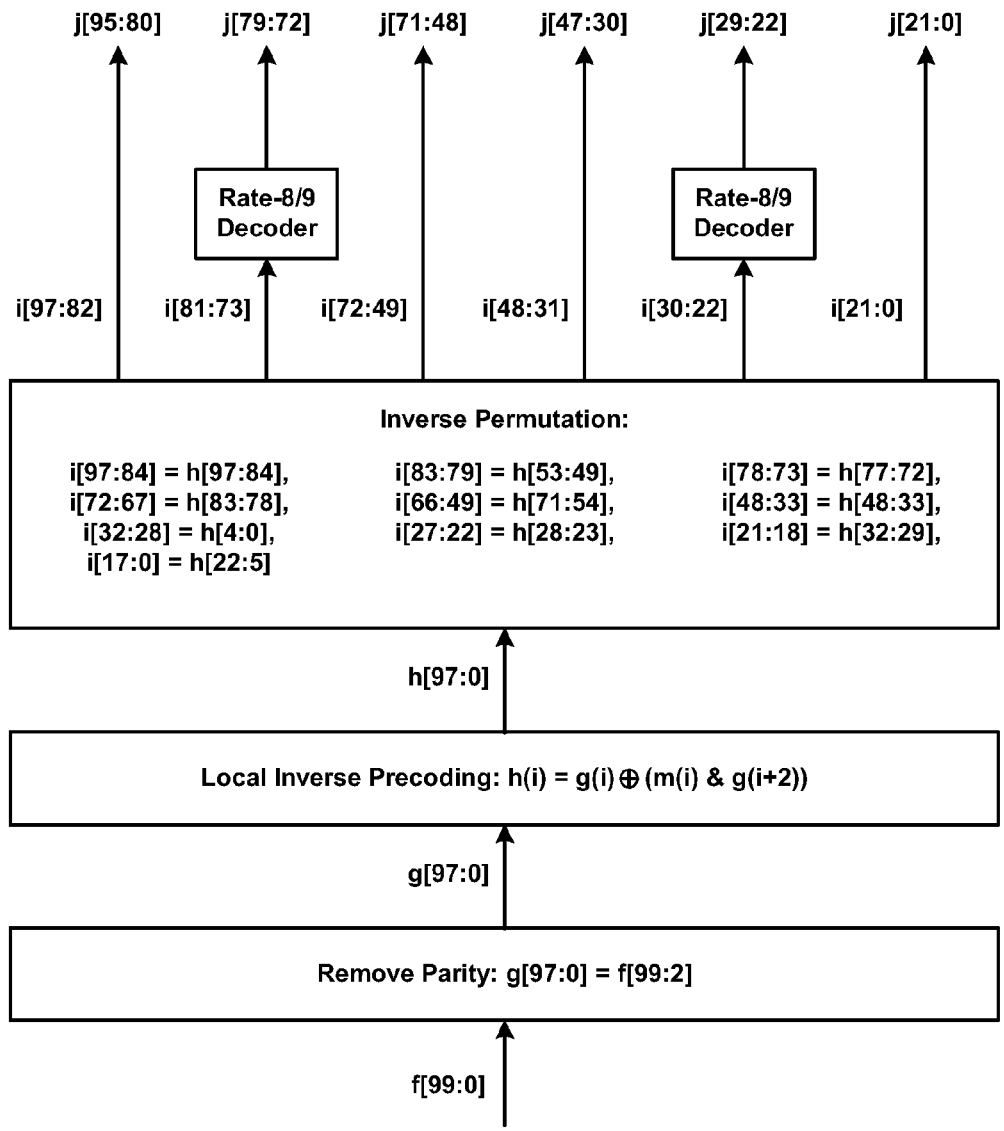
FIG. 14 shows schematically Phase 1 of the rate 96/100 decoder for a 10 bit error correction code (2 parity bits) corresponding to the encoder of FIGS. 7 to 11.
Figure 15:
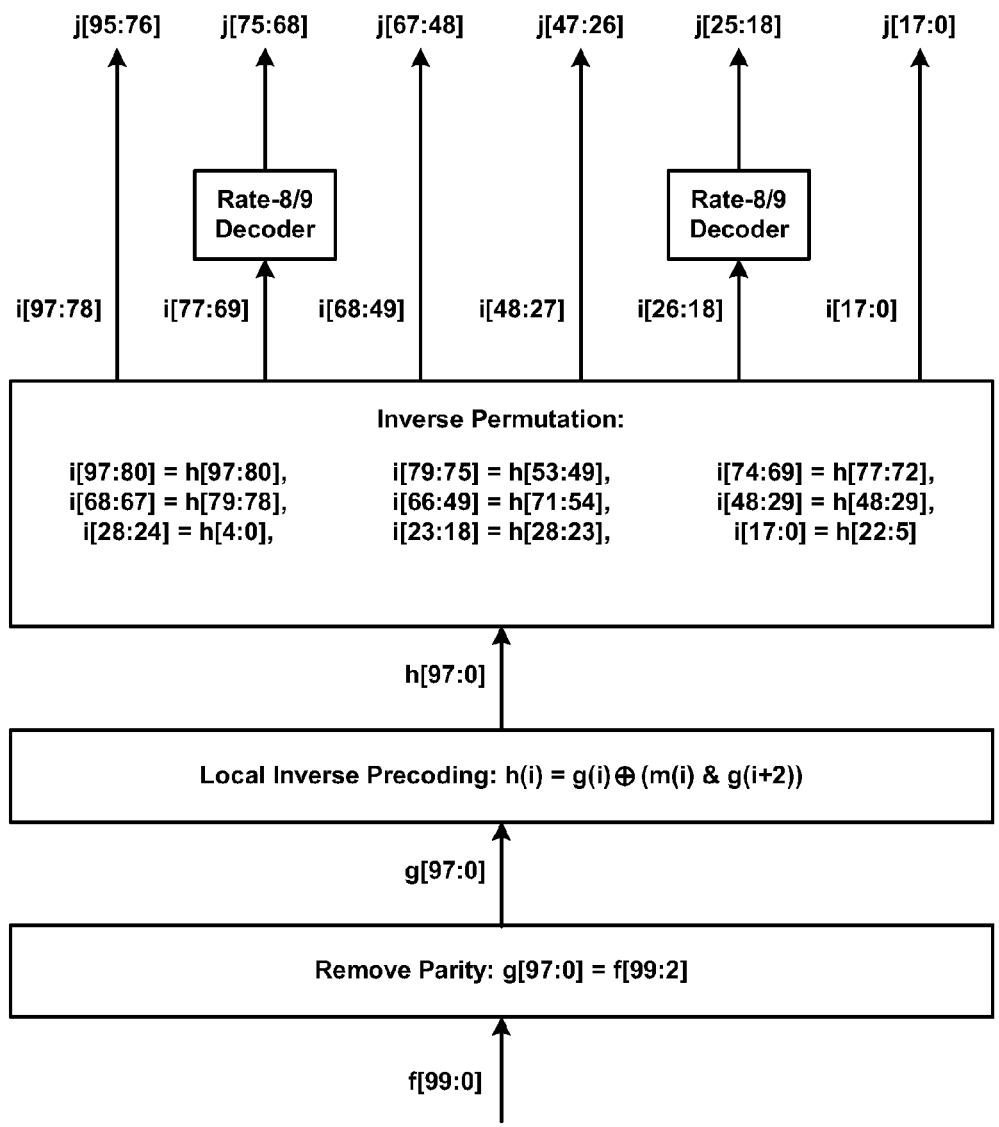
FIG. 15 shows schematically Phase 2 of the rate 96/100 decoder for a 10 bit error correction code (2 parity bits) corresponding to the encoder of FIGS. 7 to 11.
Figure 16:
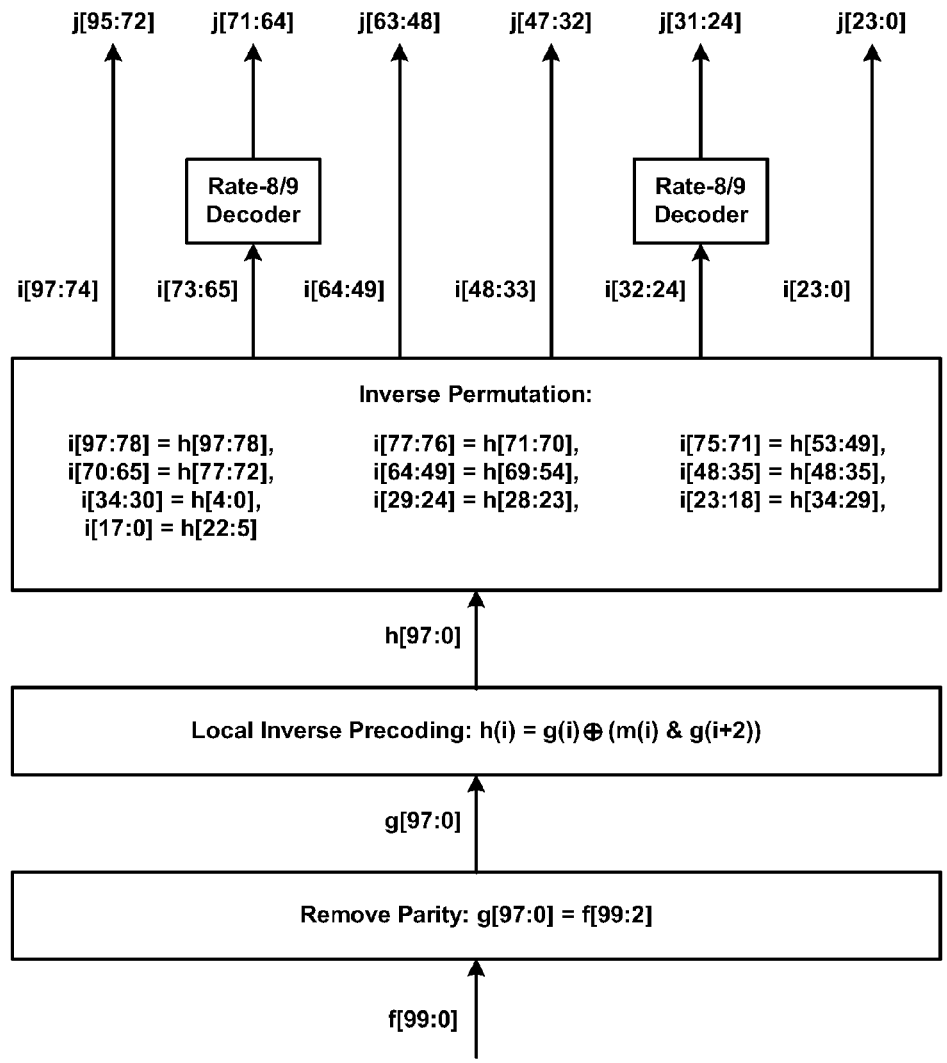
FIG. 16 shows schematically Phase 3 of the rate 96/100 decoder for a 10 bit error correction code (2 parity bits) corresponding to the encoder of FIGS. 7 to 11.
Figure 17:
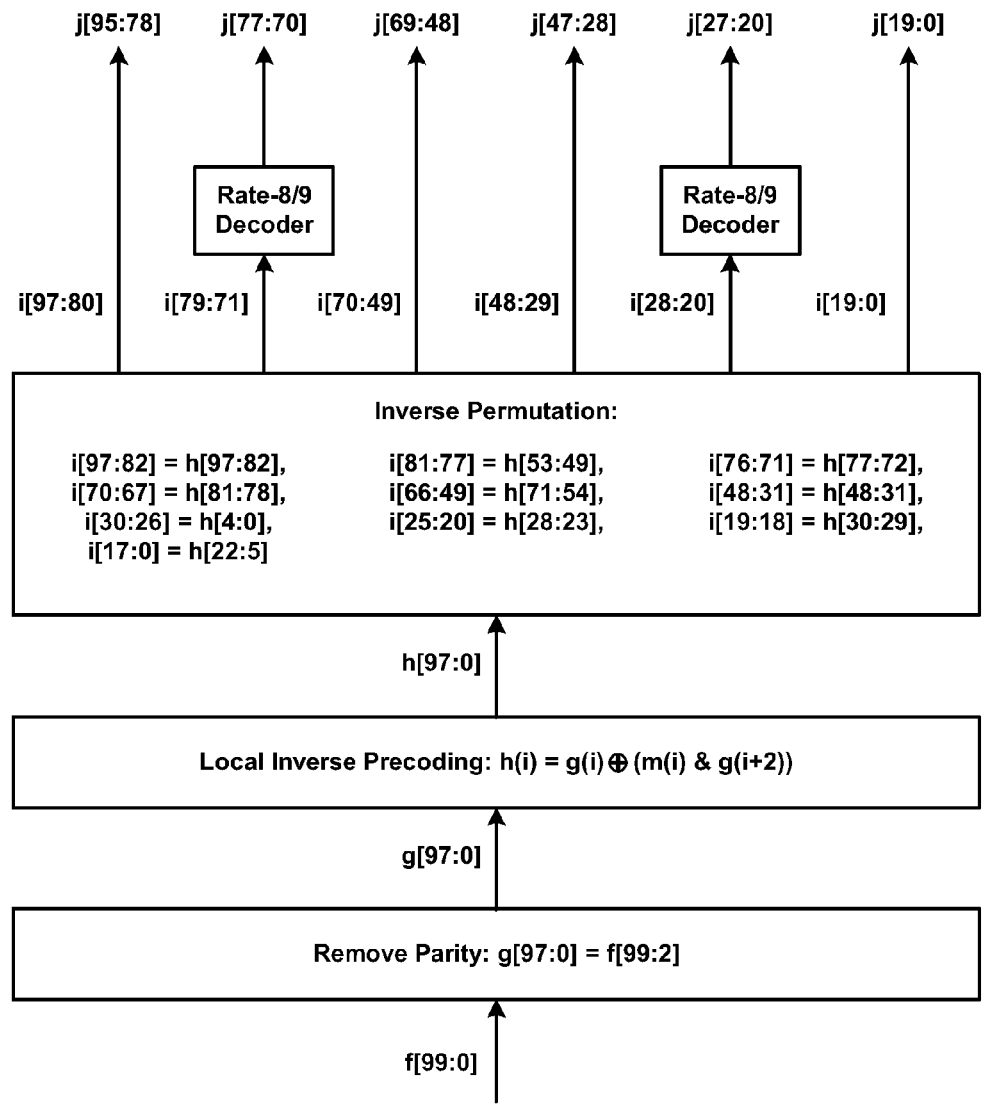
FIG. 17 shows schematically Phase 4 of the rate 96/100 decoder for a 10 bit error correction code (2 parity bits) corresponding to the encoder of FIGS. 7 to 11.
Figure 18:
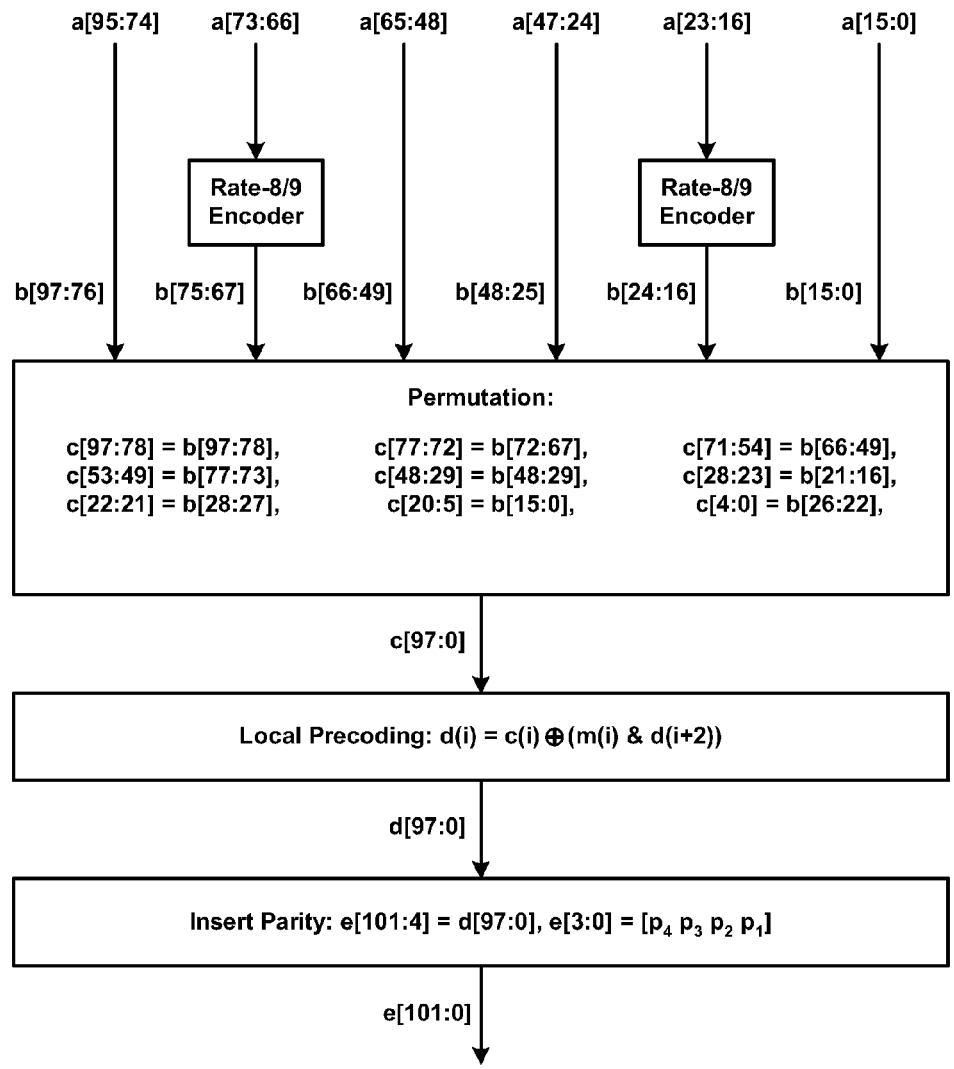
FIG. 18 shows schematically Phase 0 of a rate 96/102 encoder for a 10 bit error correction code (4 parity bits) in accordance with a fourth embodiment of the present invention.
Figure 19:
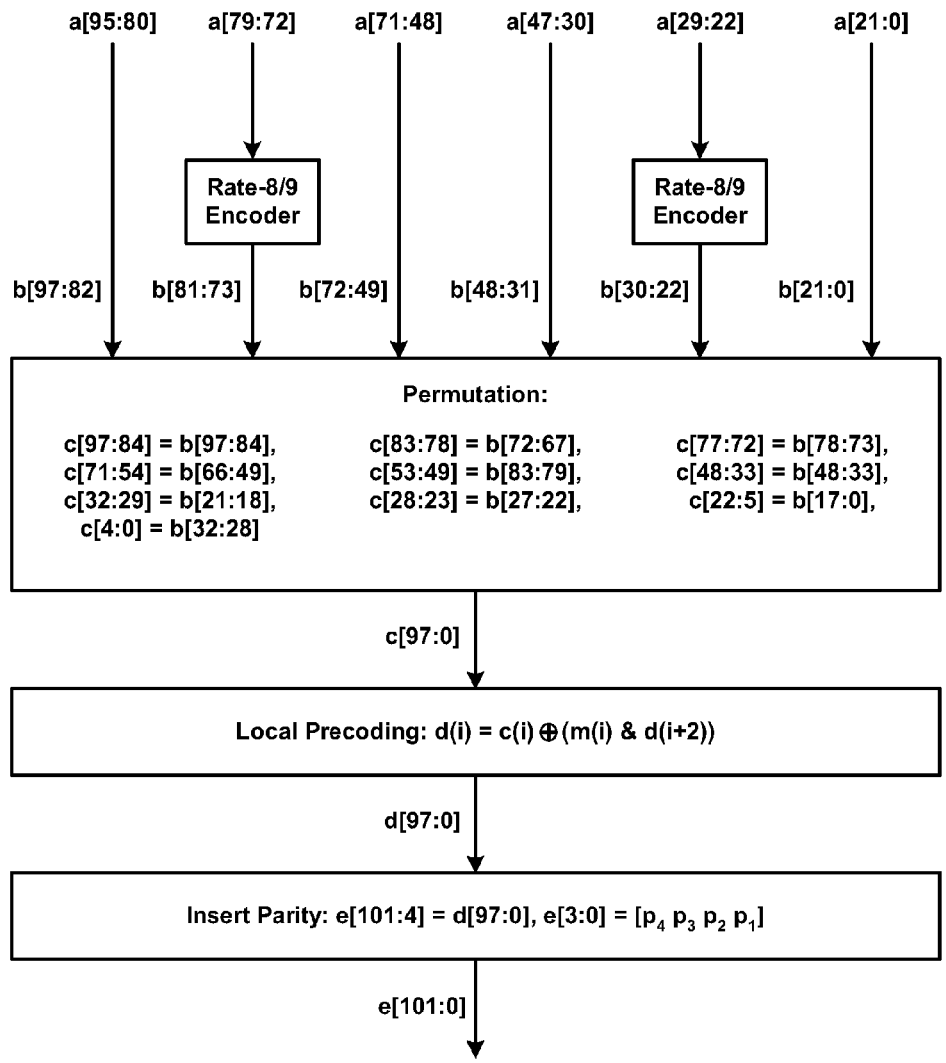
FIG. 19 shows schematically Phase 1 of a rate 96/102 encoder for a 10 bit error correction code (4 parity bits) in accordance with a fourth embodiment of the present invention.
Figure 20:
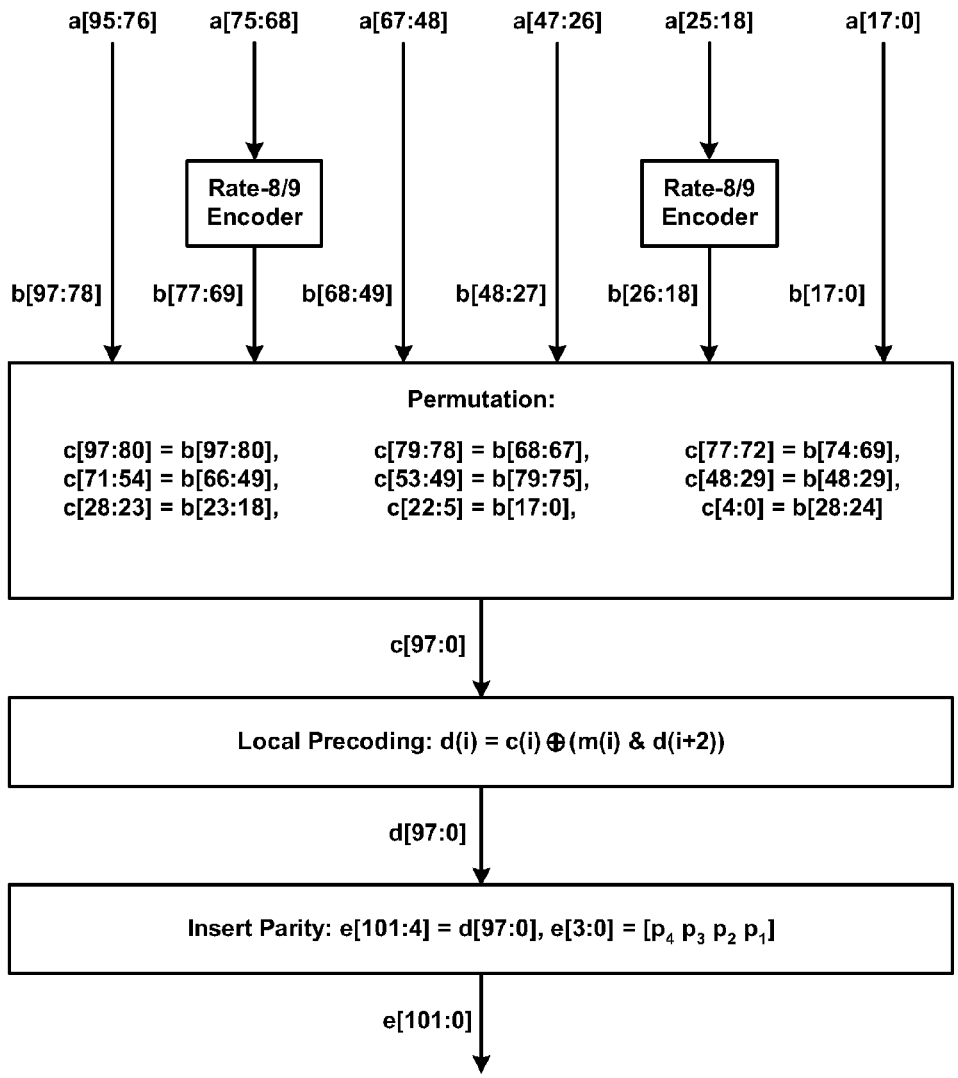
FIG. 20 shows schematically Phase 2 of a rate 96/102 encoder for a 10 bit error correction code (4 parity bits) in accordance with a fourth embodiment of the present invention.
Figure 21:
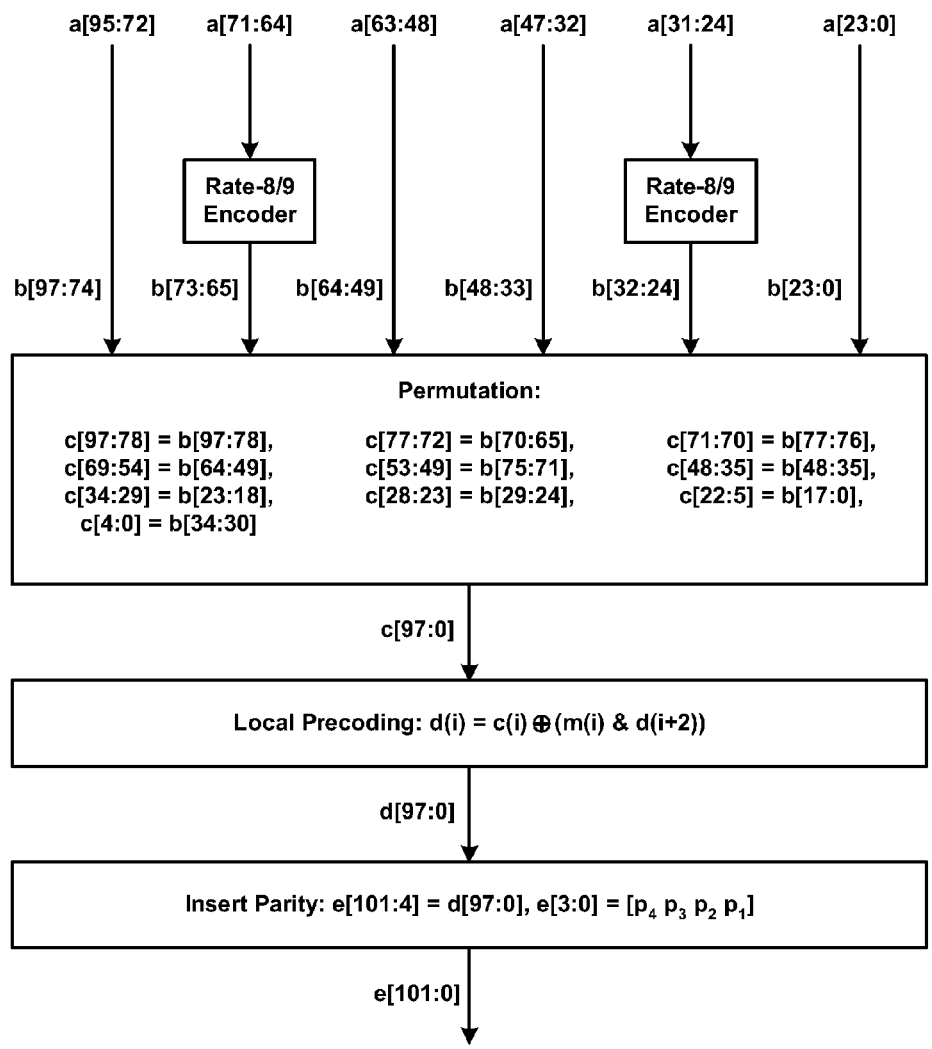
FIG. 21 shows schematically Phase 3 of a rate 96/102 encoder for a 10 bit error correction code (4 parity bits) in accordance with a fourth embodiment of the present invention.
Figure 22:
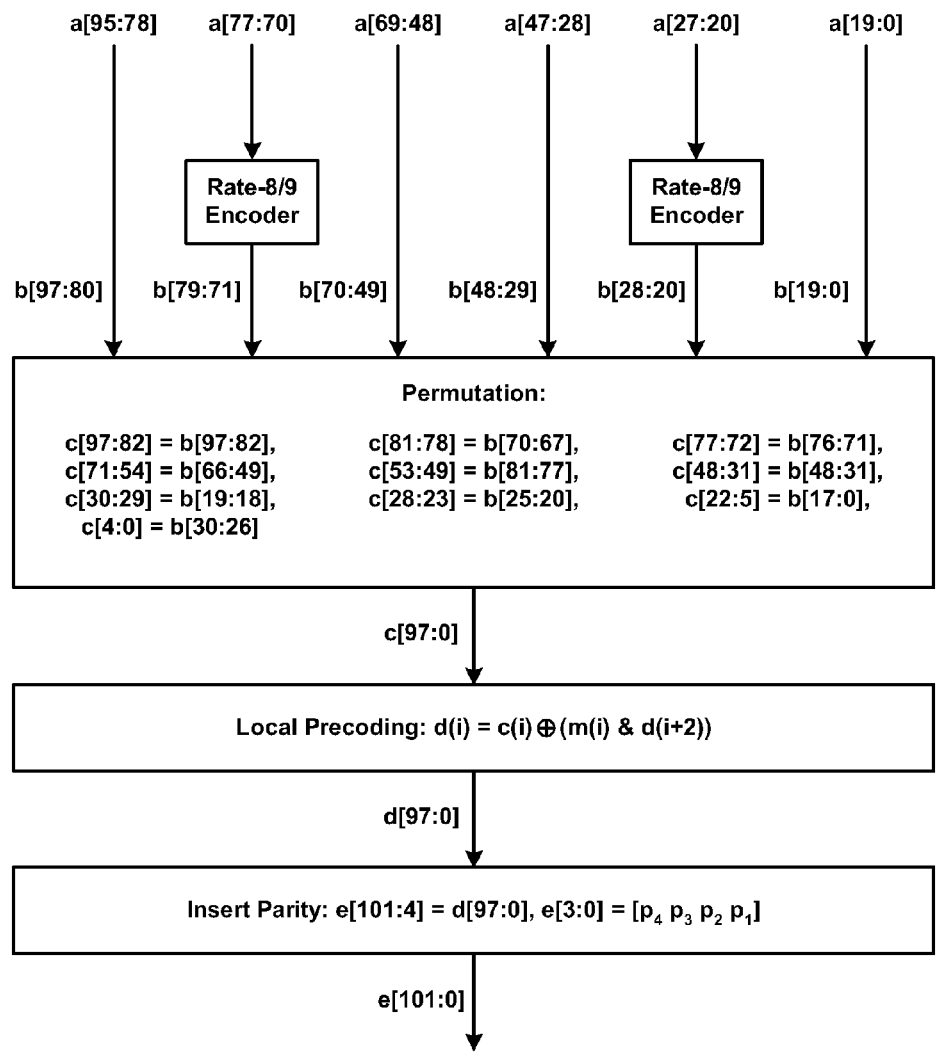
FIG. 22 shows schematically Phase 4 of a rate 96/102 encoder for a 10 bit error correction code (4 parity bits) in accordance with a fourth embodiment of the present invention.
Figure 23:
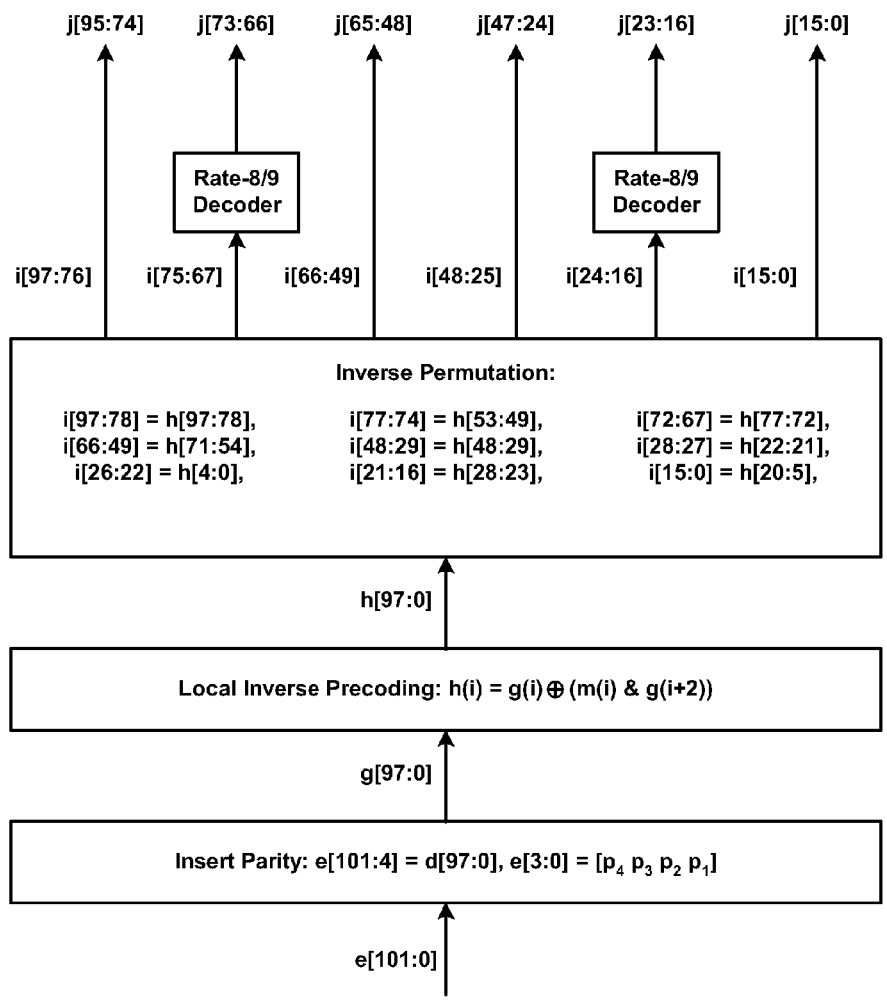
FIG. 23 shows schematically Phase 0 of the rate 96/102 decoder for a 10 bit error correction code (4 parity bits) that corresponds to the encoder of FIGS. 18 to 22.
Figure 24:
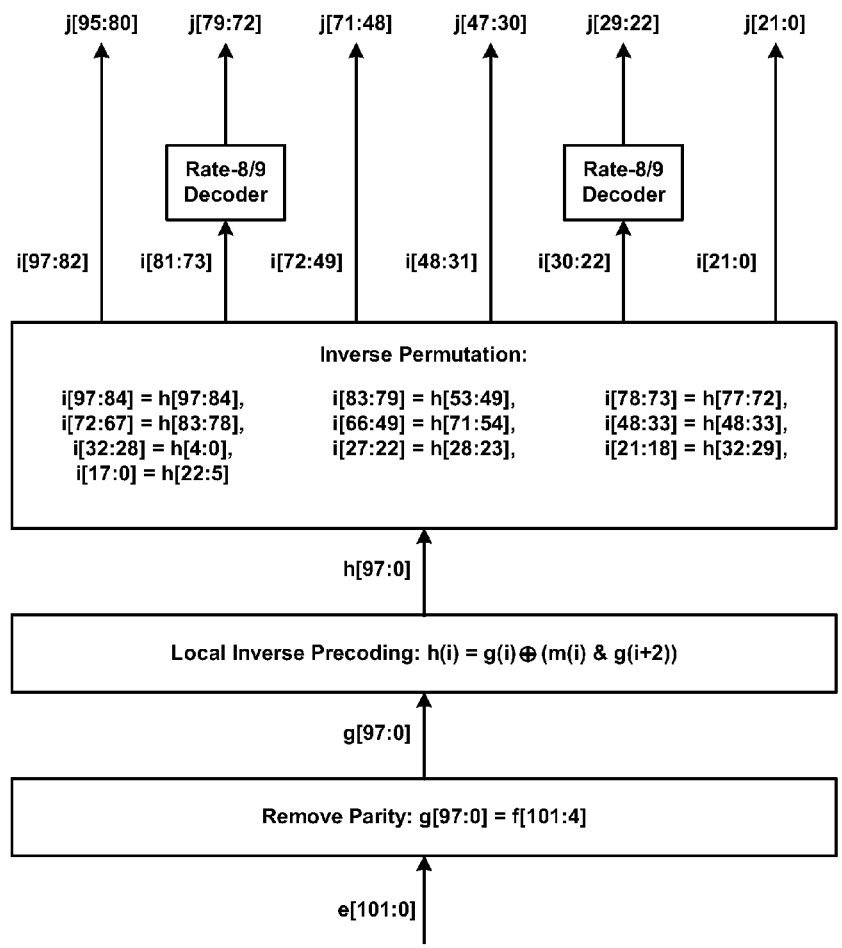
FIG. 24 shows schematically Phase 1 of the rate 96/102 decoder for a 10 bit error correction code (4 parity bits) that corresponds to the encoder of FIGS. 18 to 22.
Figure 25:
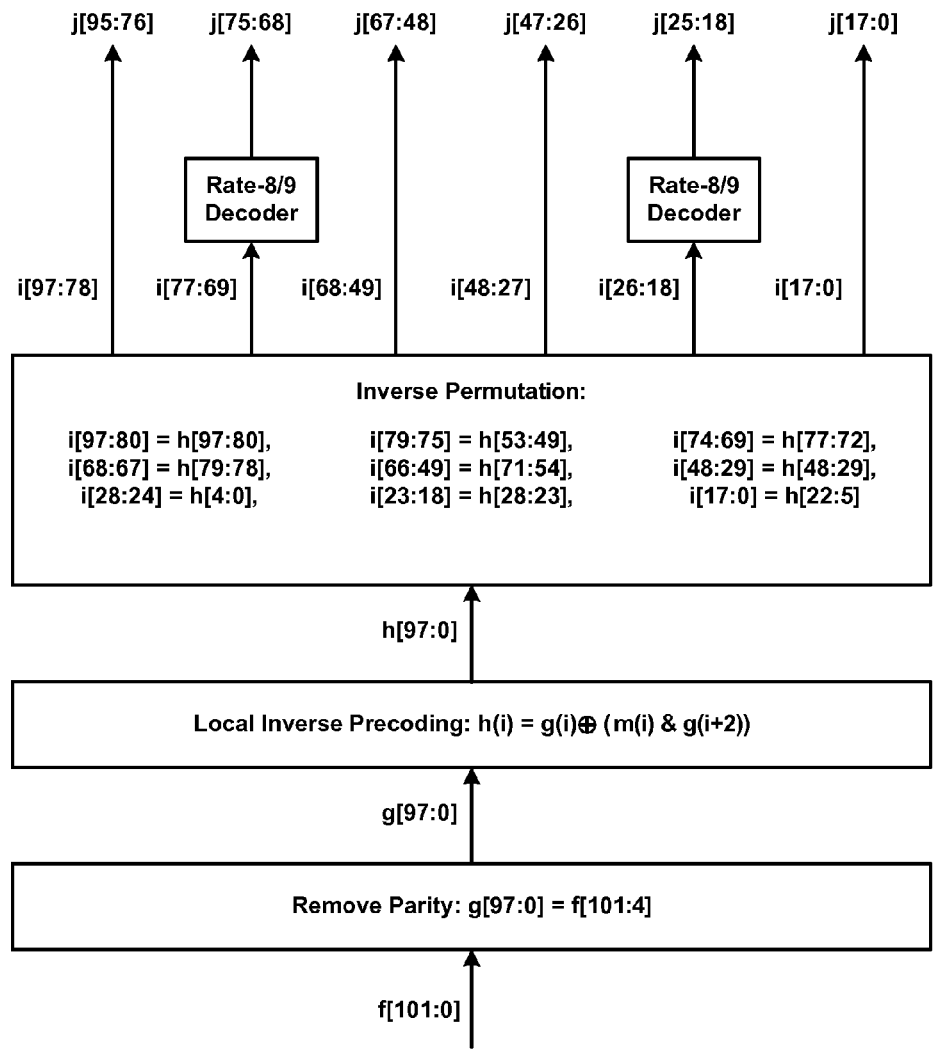
FIG. 25 shows schematically Phase 2 of the rate 96/102 decoder for a 10 bit error correction code (4 parity bits) that corresponds to the encoder of FIGS. 18 to 22.
Figure 26:
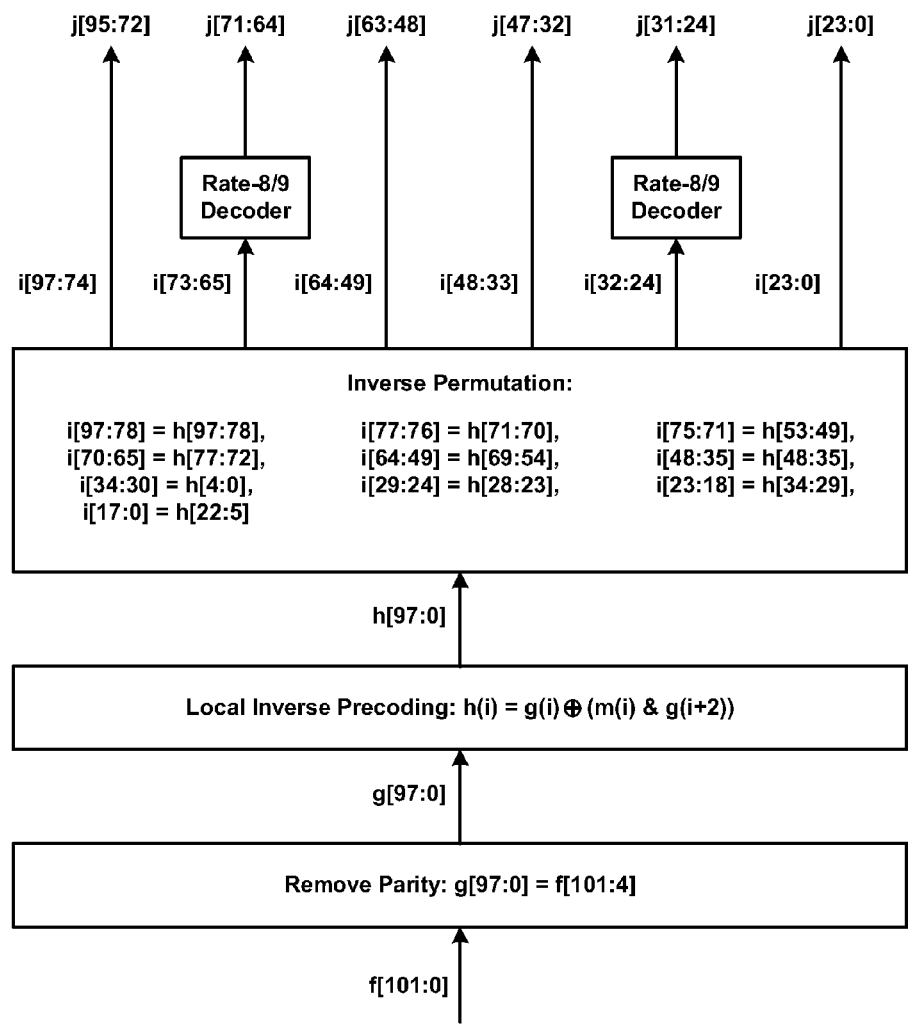
FIG. 26 shows schematically Phase 3 of the rate 96/102 decoder for a 10 bit error correction code (4 parity bits) that corresponds to the encoder of FIGS. 18 to 22.
Figure 27:
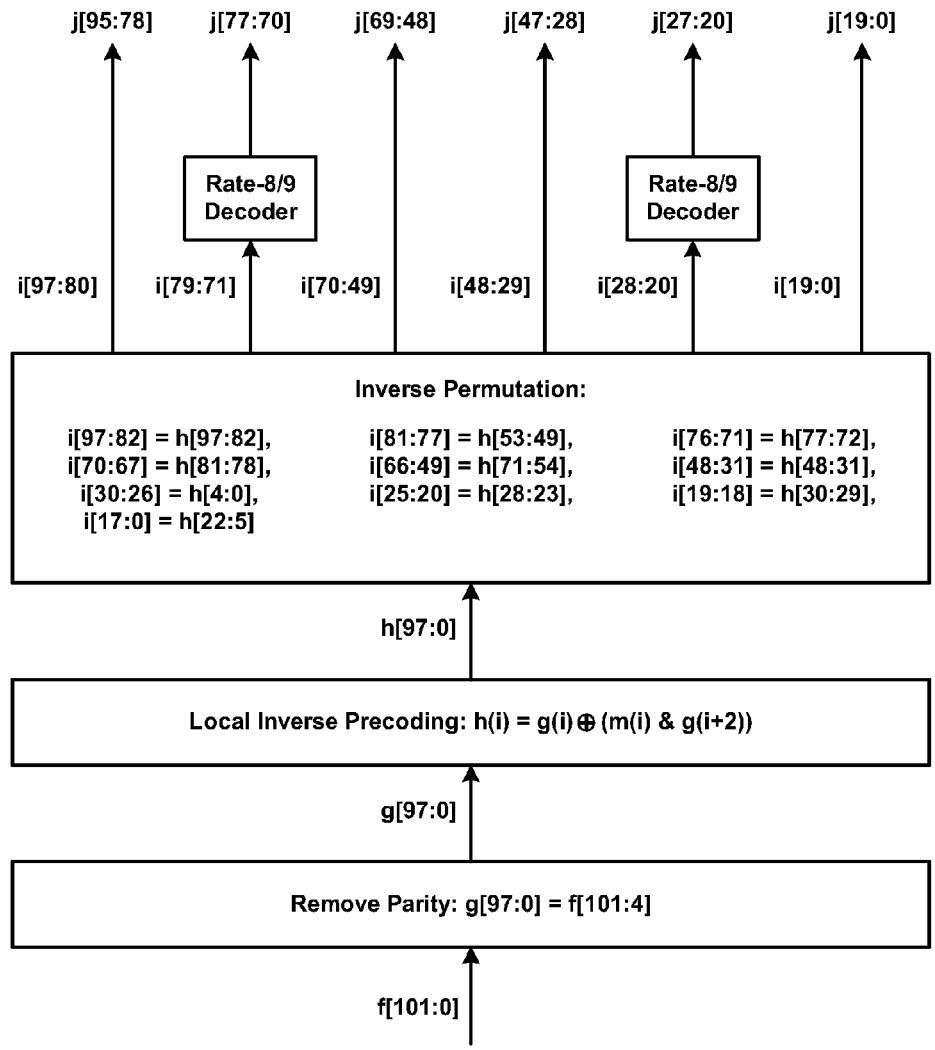
FIG. 27 shows schematically Phase 4 of the rate 96/102 decoder for a 10 bit error correction code (4 parity bits) that corresponds to the encoder of FIGS. 18 to 22.

FIG. 7 shows the corresponding rate-96/102 decoder. Again, the process is essentially the same as that shown in FIG. 5, save for the number of parity bits that need to be removed.

Thus, again, the input of the decoder, f[101:0], read from the storage medium is mapped into g[97:0] by removing the parity bits. Local inverse preceding is then performed to obtain the array h[97:0]. The same masking bits m(i), $0 \leq i \leq 97$, m(i)=1, for i=77, 76, 75, 74, 73, 72, 51, 50, 49, 28, 27, 26, 25, 24, 23, 2, 1, 0, and m(i)=0, elsewhere, as for preceding, are used. Inverse permutation is then applied to give the array i[97:0]. Finally, rate-8/9 decoding is applied to the appropriate bytes to give the output of the rate-96/102 decoder (the array j[95:0]) for providing to the error correction decoding stage.

The constraints in the stored data codeword e[101:0] of this embodiment that would be relevant to an implementation of a 16-state time-varying detector trellis are j=2 at positions 53 and 4, j=3 at positions 79, 76, 30 and 27, k=2 at positions 53 and 4, k=3 at positions 79, 76, 30 and 27.

FIGS. 8 to 12 show the five phases of another embodiment of the invention in the form of a rate 96/100 encoder for a 10-bit error correction code.

When implementing a 10-bit error correction code using a rate 96/100 encoder, it is necessary to implement 5 successive "phases" of encoding (to give an overall block of 480/500 encoding that is accordingly divisible by ten), which encoding "phases" are then continuously repeated in sequence (i.e. the first 96 bits are phase "0" encoded, the next 96 bits are phase "1" encoded, the next 96 bits are phase "2" encoded, the next 96 bits are phase "3" encoded, the next 96 bits are phase "4" encoded, the next 96 bits are phase "0" encoded, the next 96 bits are phase "1" encoded, and so on).

In the present embodiment, in each phase the input of the encoder is an error correction coded data block a[95:0], corresponding to a non-integer number of 10-bit bytes. In each phase, modulation coding is then applied to map two 10-bit bytes into 11-bit codewords, using the rate-8/9 modulation code in Table 2. (Again, the remaining bytes pass through the modulation encoding stage unchanged.)

The so-encoded signal b[97:0] is then permuted in each phase as shown in the Figures to give a permuted data block c[97:0]. The permuted signal is then subjected to selective preceding using the masking bits m(i), $0 \leq i \leq 97$, m(i)=1, for i=77, 76, 75, 74, 73, 72, 51, 50, 49, 28, 27, 26, 25, 24, 23, 2, 1, 0, and m(i)=0, elsewhere. The encoded signal after this local preceding is again denoted by d[97:0]. Finally, two parity bits that are computed using the generator polynomial $1+x^2$ are inserted. The resulting modulation/parity codeword for storage is e[99:0].

FIGS. 13 to 17 show the five phases of the corresponding rate-96/100 decoder. In each phase the input of the decoder, f[99:0], is mapped into g[97:0] by removing the parity bits. Local inverse preceding is then performed to obtain the array h[97:0], using the same masking bits m(i), $0 \leq i \leq 97$, as for the preceding, i.e., m(i)=1, for i=77, 76, 75, 74, 73, 72, 51, 50, 49, 28, 27, 26, 25, 24, 23, 2, 1, 0, and m(i)=0, elsewhere. Inverse permutation is then performed to obtain the array i[97:0]. Finally, rate-8/9 decoding is applied to the appropriate 11-bit codewords to give the output of the rate-96/100 decoder, the array j[95:0].

The constraints in stored codeword e[99:0] that would be relevant to an implementation of a 16-state time-varying detector trellis are j=2 at positions 51 and 2, j=3 at positions 77, 74, 28 and 25, k=2 at positions 51 and 2, k=3 at positions 77, 74, 28 and 25.

FIGS. 18 to FIG. 22 show the five phases of another embodiment of the invention in the form of a rate-96/102 encoder for a 10-bit error correction code. In each phase the input of the encoder is again an error correction coded data block a[95:0], corresponding to a non-integer number of 10-bit bytes. In each phase, modulation coding is then applied two 10-bit bytes only to map them into 11-bit codewords, using the rate-8/9 modulation code in Table 2.

The so-encoded signal b[97:0] is then permuted as shown in the Figures to give a permuted data block c[97:0]. The permuted signal is then subjected to selective preceding using the masking bits m(i), $0 \leq i \leq 97$, m(i)=1, for i=77, 76, 75, 74, 73, 72, 51, 50, 49, 28, 27, 26, 25, 24, 23, 2, 1, 0, and m(i)=0, elsewhere. The encoded signal after this local preceding is again denoted by d[97:0]. Finally, four parity bits that are computed using the generator polynomial $1+x+x^4$ are inserted. The resulting modulation/parity codeword for storage is e[101:0].

FIGS. 23 to 27 show the five phases of the corresponding rate-96/102 decoder. In each phase the input of the decoder, f[101:0], is as before mapped into g[97:0] by removing the parity bits. Local inverse preceding is then performed to obtain the array h[97:0], using the same masking bits m(i), $0 \leq i \leq 97$, as for the preceding, i.e., m(i)=1, for i=77, 76, 75, 74, 73, 72, 51, 50, 49, 28, 27, 26, 25, 24, 23, 2, 1, 0, and m(i)=0, elsewhere. Inverse permutation is then performed to obtain the array i[97:0]. Finally, rate-8/9 decoding is applied to the appropriate two 11-bit codewords to give the output of the rate-96/102 decoder, the array j[95:0].

The constraints in the stored codeword e[101:0] in this embodiment that would be relevant to an implementation of a 16-state time-varying detector trellis are j=2 at positions 53 and 4, j=3 at positions 79, 76, 30 and 27, k=2 at positions 53 and 4, k=3 at positions 79, 76, 30 and 27.

Some more preferred embodiments of suitable data encoding and decoding schemes that operate in accordance with the present invention will now be described with reference to FIGS. 28 to 31. These embodiments use code rates of 100/104 and 100/106 for a 10-bit error correction code (Reed-Solomon code). They use the same rate 8/9 modulation code for modulation coding as for the preceding embodiments (i.e. the modulation code shown in Table 2).

Table 3 lists the properties of these new codes (using the same conventions as Table 1):

| Rate | Parity | ECC | k | j | I |
| --- | --- | --- | --- | --- | --- |
| 100/104 | 2 | 10-bit | 27 | 27 | 28 |
| 100/106 | 4 | 10-bit | 28 | 28 | 29 |

Figure 28:
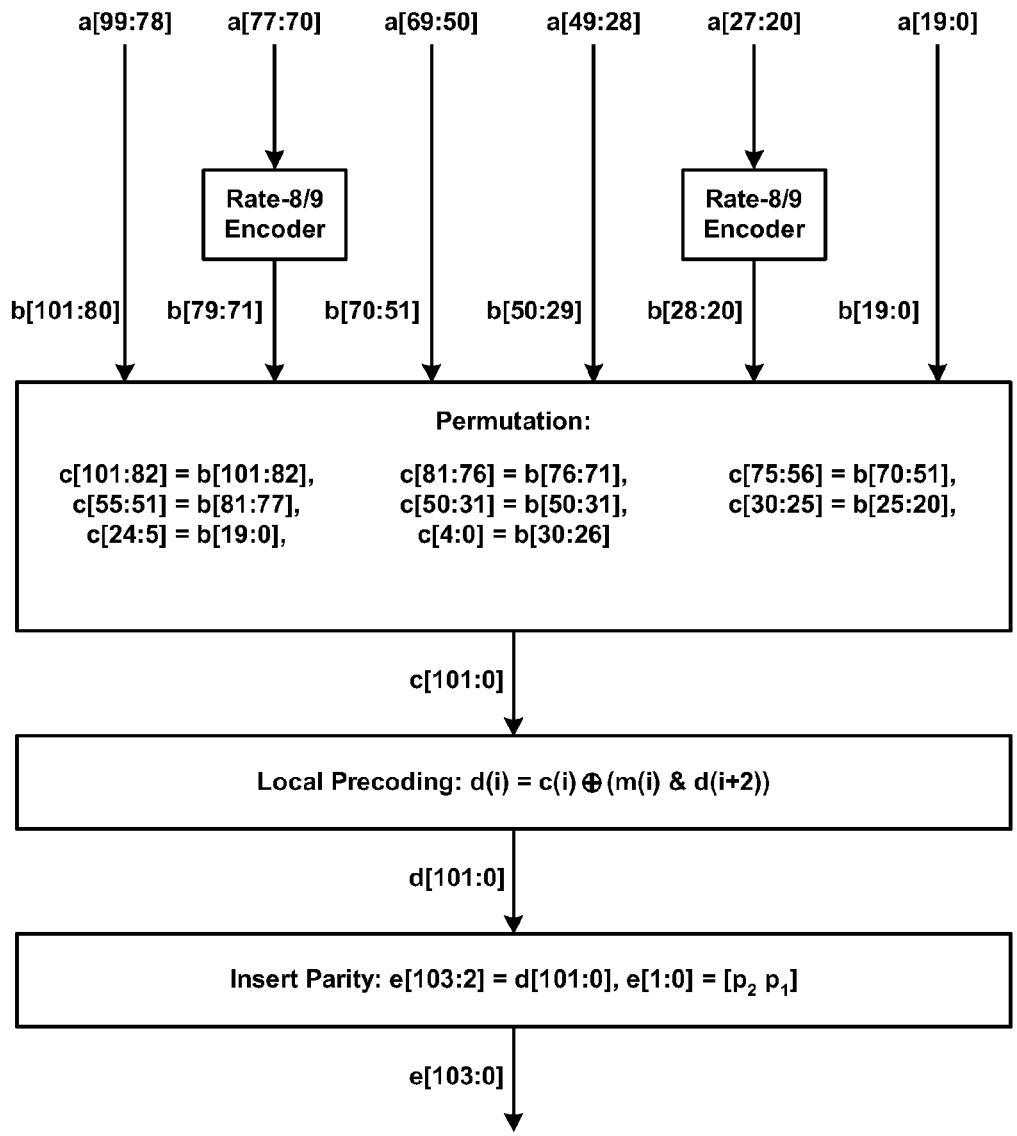
FIG. 28 shows schematically a rate 100/104 encoder (2 parity bits) in accordance with one embodiment of the invention.

FIG. 28 shows the rate-100/104 encoder for a 10-bit error correction code.

The input of the encoder, a[99:0], consists of ten 10-bit bytes, B9, . . . , B0. The bytes B7 and B2 are modulation coded to map them into 11-bit codewords using the rate-8/9 modulation code in Table 2. The remaining bytes remain unchanged. The so-encoded signal b[101:0] is then permuted as shown in FIG. 28 to give the signal c[101:0].

The permuted signal is then subjected to selective preceding using the masking bits m(i), $0 \leq i \leq 101$, where m(i)=1, for i=81, 80, 79, 78, 77, 76, 53, 52, 51, 30, 29, 28, 27, 26, 25, 2, 1, 0, and m(i)=0 elsewhere. The encoded signal after this local preceding is denoted by d[101:0]. Finally, two parity bits that are computed using the generator polynomial $1+x^2$ are inserted. The resulting modulation/parity codeword is e[103:0].

Figure 29:
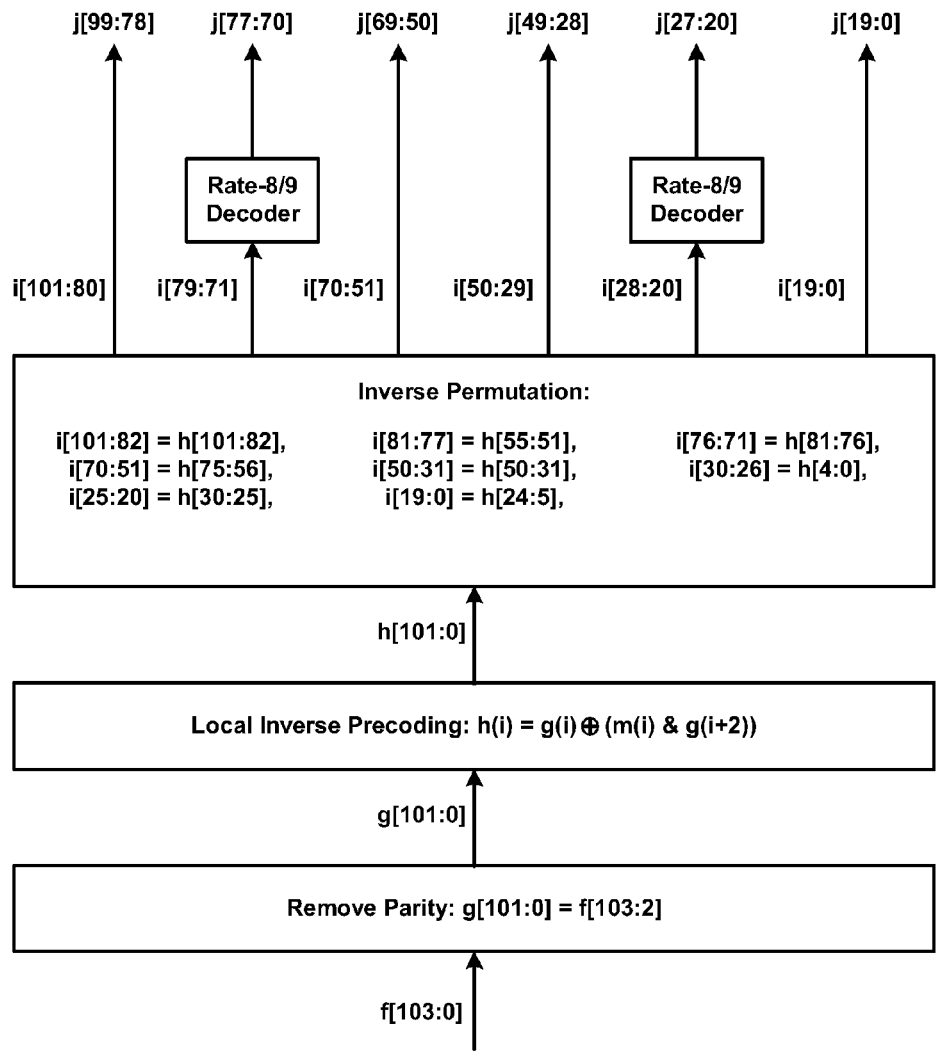
FIG. 29 shows schematically a rate 100/104 decoder (2 parity bits) in accordance with one embodiment of the invention.

FIG. 29 shows the corresponding rate-100/104 decoder. The input of the decoder, f[103:0], is mapped into g[101:0] by removing the parity bits. Local inverse preceding is then performed to obtain the array h[101:0]. The same masking bits m(i), $0 \leq i \leq 101$, m(i)=1, for i=81, 80, 79, 78, 77, 76, 53, 52, 51, 30, 29, 28, 27, 26, 25, 2, 1, 0, and m(i)=0 elsewhere, as for preceding are used. Inverse permutation is then applied to give the array i[101:0]. Finally, rate-8/9 decoding is applied to the appropriate bytes to give the output of the rate-100/104 decoder, being the array j[99:0].

The constraints in the data codeword e[103:0] that would be relevant to an implementation of a 16-state time-varying detector trellis are j=2 at positions 53 and 2, j=3 at positions 81, 78, 30 and 27, k=2 at positions 53 and 2, k=3 at positions 81, 78, 30 and 27.

Figure 30:
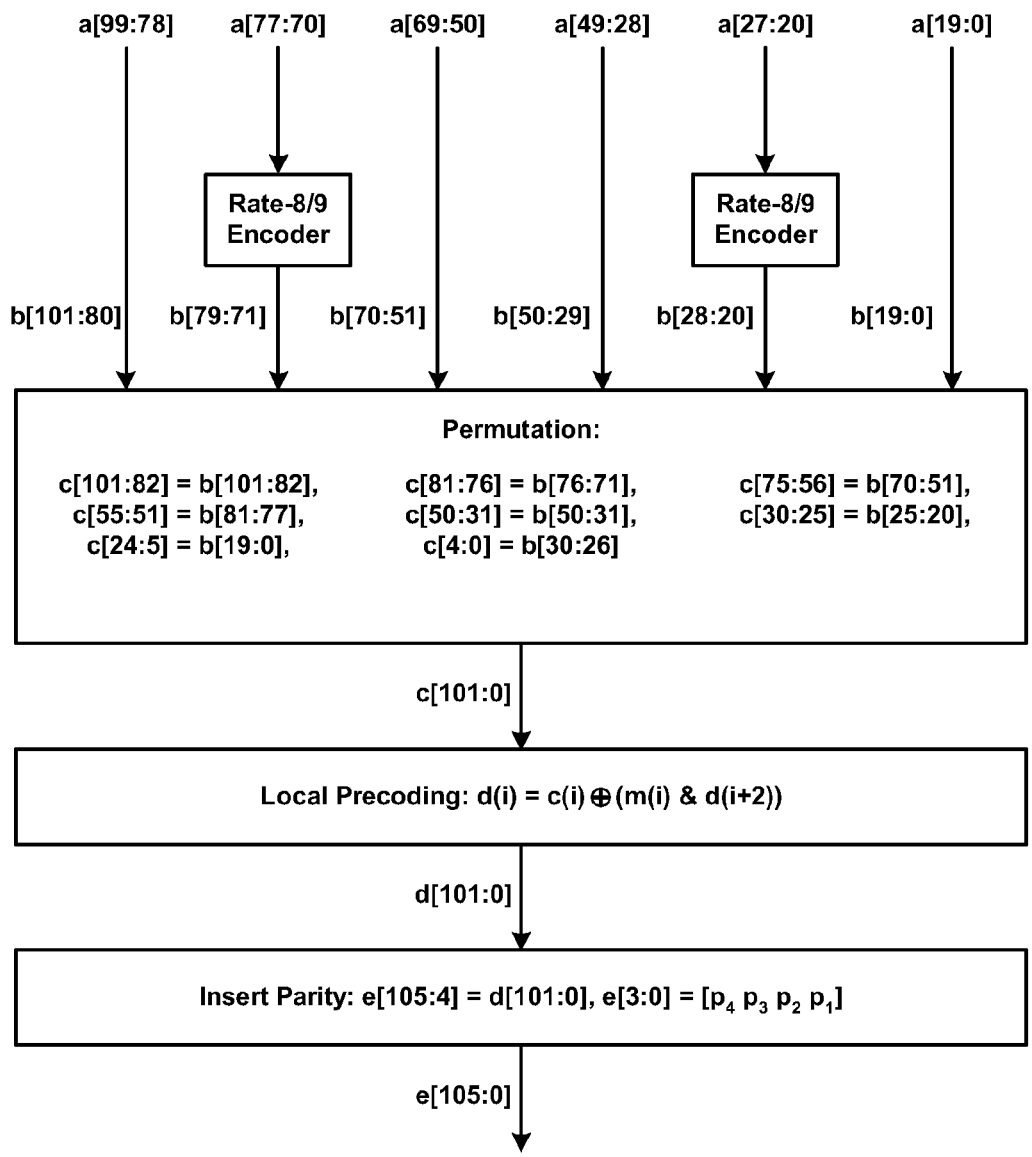
FIG. 30 shows schematically a rate 100/106 encoder (4 parity bits) in accordance with one embodiment of the invention.

FIG. 30 shows another preferred embodiment in the form of a rate-100/106 encoder for a 10-bit error correction code. The input of the encoder, a[99:0], consists of ten 10-bit bytes, B9, . . . , B0. The bytes B7 and B2 are modulation coded to map them into 11-bit codewords using the rate-8/9 modulation code in Table 2. The remaining bytes remain unchanged. The so-encoded signal b[101:0] is then permuted as shown in FIG. 30 to give the signal c[101:0].

The permuted signal is then subjected to selective preceding using the masking bits m(i), $0 \leq i \leq 101$, where m(i)=1, for i=81, 80, 79, 78, 77, 76, 53, 52, 51, 30, 29, 28, 27, 26, 25, 2, 1, 0, and m(i)=0 elsewhere. The encoded signal after this local preceding is denoted by d[101:0]. Finally, four parity bits that are computed using the generator polynomial $1+x+x^4$ are inserted. The resulting modulation/parity codeword is e[105:0].

Figure 31:
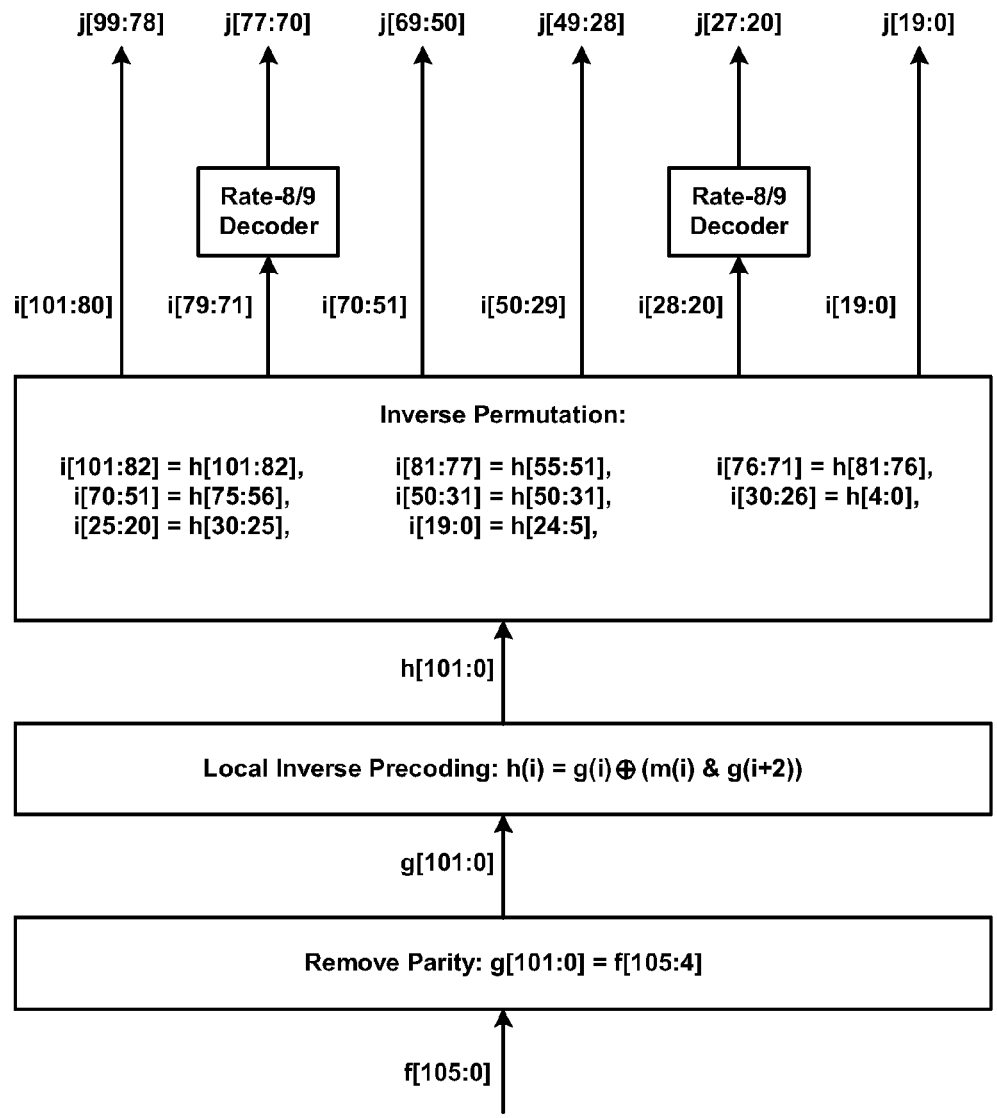
FIG. 31 shows schematically a rate 100/106 decoder (4 parity bits) in accordance with one embodiment of the invention.

FIG. 31 shows the corresponding rate-100/106 decoder. The input of the decoder, f[105:0], is mapped into g[101:0] by removing the parity bits. Local inverse preceding is then performed to obtain the array h[101:0]. The same masking bits m(i), 0≦i≦101, m(i)=1, for i=81, 80, 79, 78, 77, 76, 53, 52, 51, 30, 29, 28, 27, 26, 25, 2, 1, 0, and m(i)=0 elsewhere, as for preceding, are used. Inverse permutation is then applied to give the array i[101:0]. Finally, rate-8/9 decoding is applied to the appropriate bytes to give the output of the rate-100/106 decoder, being the array j[99:0]. The constraints in the data codeword e[105:0] that would be relevant to an implementation of a 16-state time-varying detector trellis are j=2 at positions 55 and 4, j=3 at positions 83, 80, 32 and 29, k=2 at positions 55 and 4, k=3 at positions 83, 80, 32 and 29.

Further preferred embodiments of suitable data encoding and decoding schemes that operate in accordance with the present invention are shown in FIGS. 32 to 35. These embodiments are designed for use with 8-bit or 10-bit error correction codes (Reed-Solomon codes) and use the same rate 8/9 modulation code for modulation coding as the preceding embodiments (i.e. the modulation code shown in Table 2).

In the following embodiments, the code rate 64/66 is used for an 8-bit error correction code, and the code rate 60/62 is used for a 10-bit error correction code. Table 4 lists the properties of these new codes (using the same conventions as Table 1):

| Rate  | Parity | ECC    | k  | j  | I  |
|-------|--------|--------|----|----|----|
| 64/66 | 1      | 8-bit  | 33 | 33 | 34 |
| 60/62 | 1      | 10-bit | 31 | 31 | 32 |

In these (and the other) embodiments, a flag detecting an illegal codeword at the modulation decoder input could also be used in conjunction with a Reed-Solomon decoder that performs on the fly error-and-erasure decoding. This would allow the sector-error rate performance to be improved.

Figure 32:
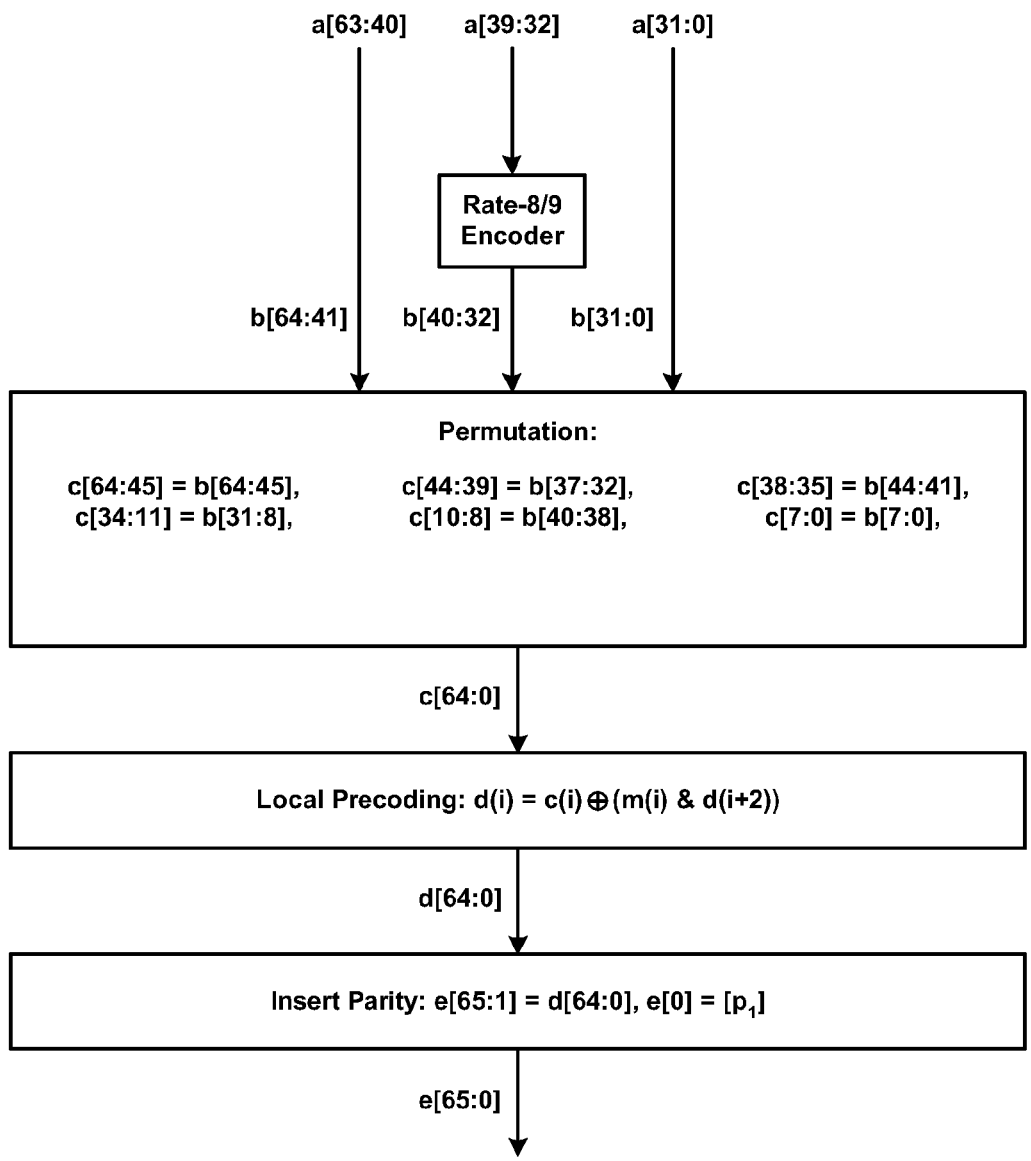
FIG. 32 shows schematically a rate 64/66 encoder (1 parity bit) in accordance with one embodiment of the invention.

FIG. 32 shows an embodiment in the form of a rate-64/66 encoder for an 8-bit error correction code. The input to the modulation-coding stage, a[63:0], consists of eight error correction coded 8-bit bytes, B7, B6, . . . , B0. As shown in FIG. 32, the byte B5 is mapped into a 9-bit codeword using the rate-8/9 modulation code of Table 2. The remaining bytes are left unchanged after the modulation coding stage.

The bit sequence is then permuted as shown in FIG. 32. The encoded signal before permutation is denoted by b[64:0], and the encoded signal after permutation is denoted by c[64:0]. Selective preceding is then performed using a "mask" denoted by the masking bits m(i), 0≦i≦64, where m(i)=1, for i=44, 43, 42, 41, 40, 39, 10, 9, 8 and m(i)=0 elsewhere. The encoded signal after this local preceding is denoted by d[64:0]. Finally, a parity bit is computed using the generator polynomial 1+x and is inserted into the bit block. The resulting modulation/parity codeword that is to be written to the storage medium is e[65:0].

Figure 33:
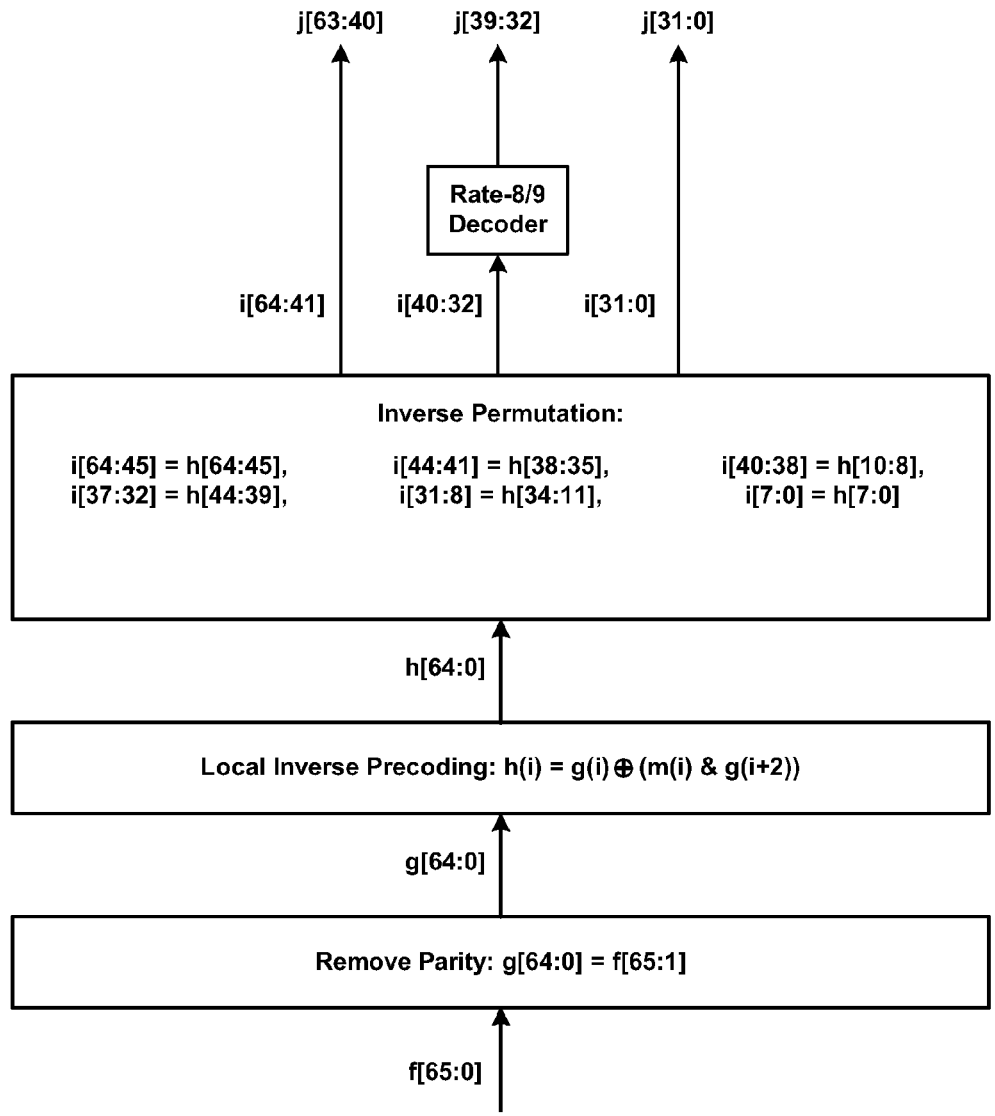
FIG. 33 shows schematically a rate 64/66 decoder (1 parity bit) in accordance with one embodiment of the invention.

FIG. 33 shows the corresponding rate-64/66 decoder. The input of the decoder, f[65:0], is mapped into g[64:0] after removing the parity bit. Local inverse preceding is then performed to obtain the array h[64:0] using the same masking bits m(i), 0≦i≦64, m(i)=1, for i=44, 43, 42, 41, 40, 39, 10, 9, 8 and m(i)=0 elsewhere, as for the preceding. The data block is then subjected to inverse permutation, after which the array i[64:0] is obtained. The appropriate byte of codeword i[64:0] is then subjected to modulation decoding using the rate-8/9 code of Table 2 to give the output of the rate-64/66 decoder being the array j[63:0] for input to the error correction decoding stage (not shown). The constraints in the data codeword e[65:0] that would be relevant to an implementation of a 16-state time-varying detector trellis are j=2 at position 9, j=3 at positions 43 and 40, k=2 at position 9, k=3 at positions 43 and 40.

Figure 34:
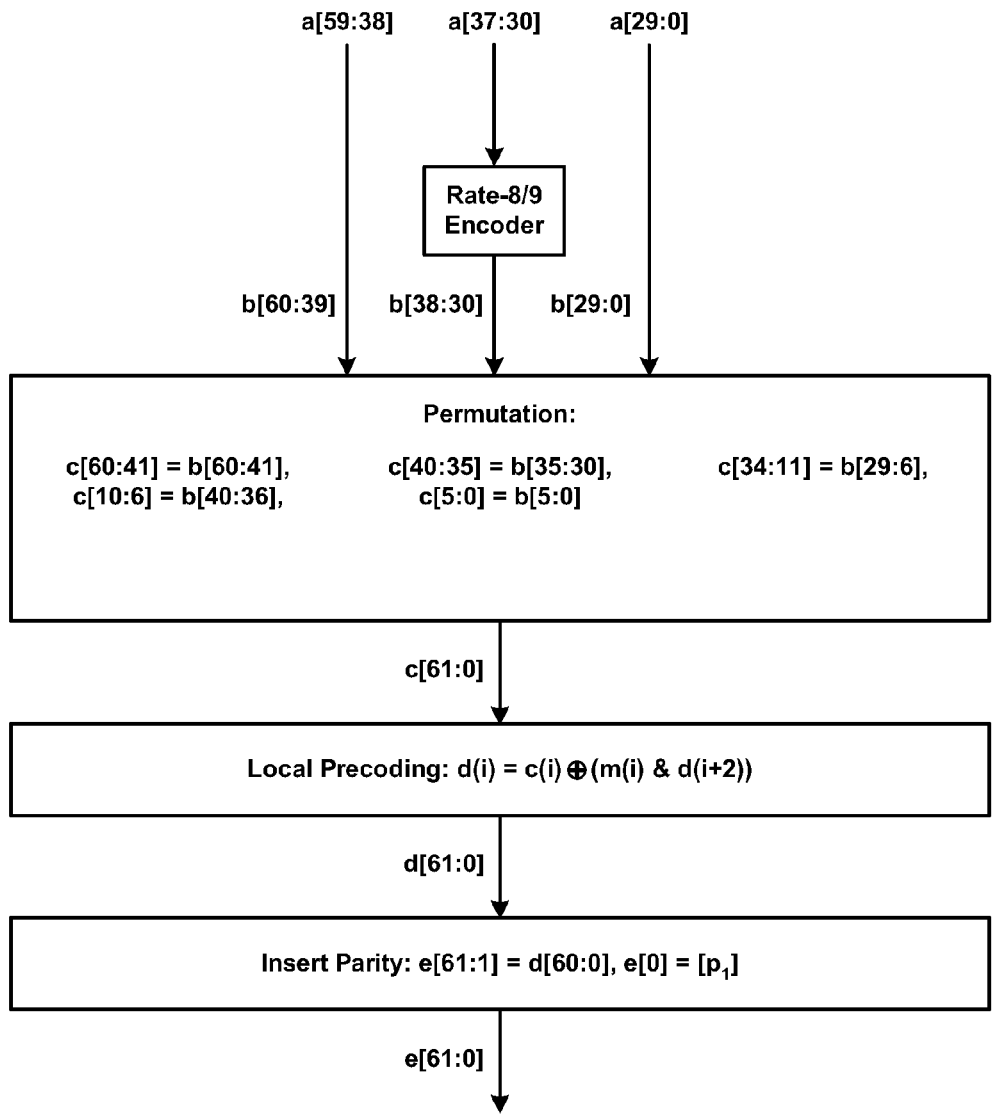
FIG. 34 shows schematically a rate 60/62 encoder (1 parity bit) in accordance with one embodiment of the invention.

FIG. 34 shows another preferred embodiment in the form of a rate-60/62 encoder for a 10-bit error correction code. The input of the encoder, a[59:0], consists of six 10-bit bytes, B5, . . . , B0. The byte B3 is mapped into an 11-bit codeword using the rate-8/9 modulation code of Table 2. The remaining bytes remain unchanged. The so-encoded signal b[60:0] is then permuted as shown in FIG. 34 to give the signal c[60:0].

The permuted signal is then subjected to selective preceding using the masking bits m(i), 0≦i≦60, where m(i)=1, for i=40, 39, 38, 37, 36, 35, 8, 7, 6, and m(i)=0 elsewhere. The encoded signal after this local preceding is denoted by d[60:0]. Finally, one parity bit that is computed using the generator polynomial 1+x is inserted. The resulting modulation/parity codeword is e[61:0].

Figure 35:
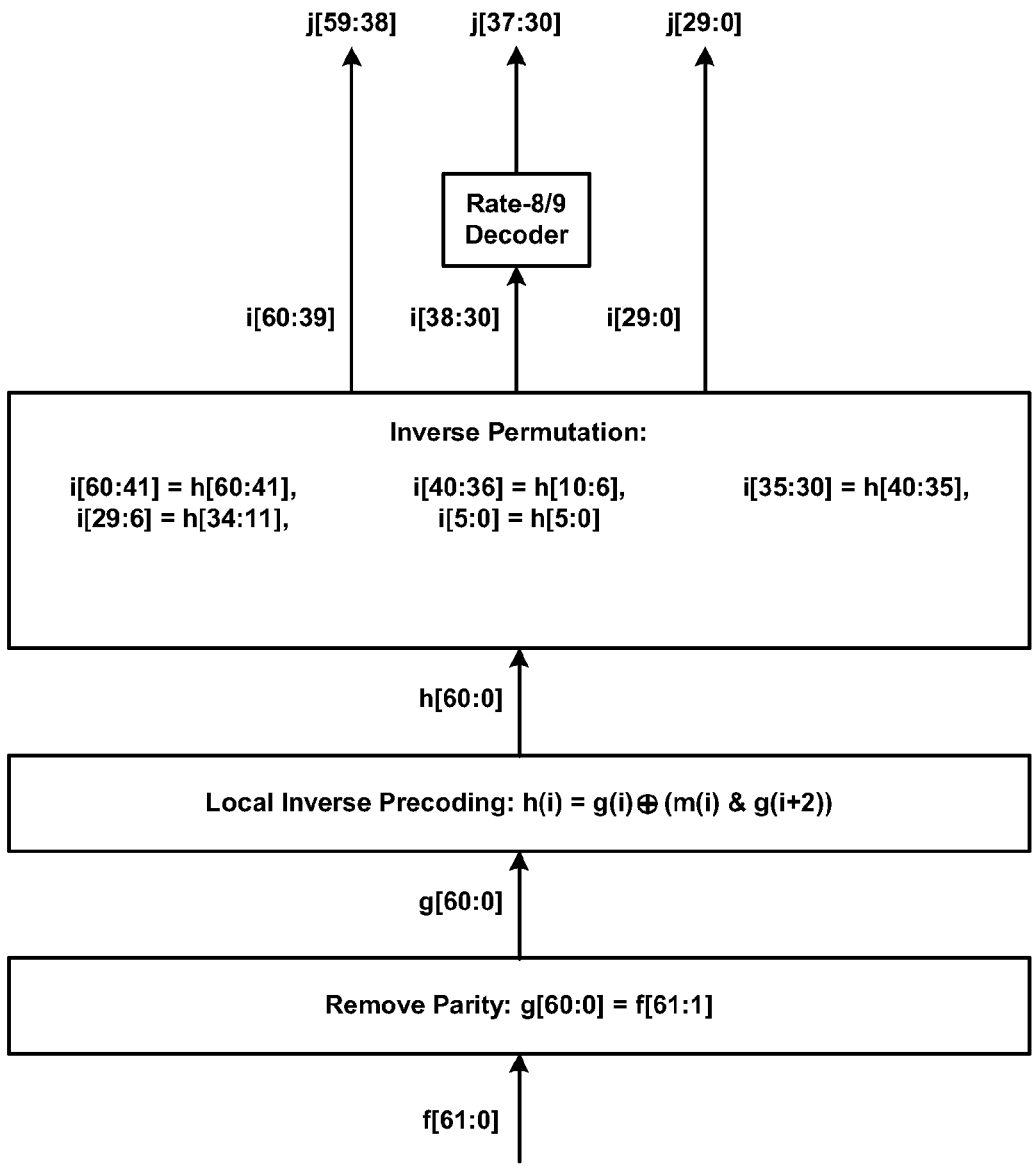
FIG. 35 shows schematically a rate 60/62 decoder (1 parity bit) in accordance with one embodiment of the invention.

FIG. 35 shows the corresponding rate-60/62 decoder. The input of the decoder, f[61:0], is mapped into g[60:0] by removing the parity bit. Local inverse preceding is then performed to obtain the array h[60:0]. The same masking bits m(i), 0≦i≦60, m(i)=1, for i=40, 39, 38, 37, 36, 35, 8, 7, 6, and m(i)=0 elsewhere, as for preceding are used. Inverse permutation is then applied to give the array i[60:0]. Finally, rate-8/9 decoding is applied to the appropriate byte to give the output of the rate-60/62 decoder, being the array j[59:0]. The constraints in the data codeword e[61:0] that would be relevant to an implementation of a 16-state time-varying detector trellis are j=2 at position 7, j=3 at positions 39 and 36, k=2 at position 7, k=3 at positions 39 and 36.

FIGS. 36 to 39 show a further preferred embodiment of the present invention. In this embodiment, the same logic conventions as for the previous embodiments are used. However, as will be explained further below, this embodiment uses 1/(1 ⊕ D) preceding, and thus in this embodiment the local preceding operation is specified by the equation $$c(i)=b(i)\oplus(m(i)\ \&\ c(i+1)),$$

where b(i) is the bit at the input of the precoder, c(i) is the bit at the output of the precoder, and m(i) is the masking bit at index i. In other words, c(i)=b(i) (no preceding), if m(i)=0, and c(i)=b(i) ⊕ c(i+1) (preceding), if m(i)=1.

Similarly, the local inverse preceding operation is specified by the equation $$g(i)=f(i)\oplus(m(i)\ \&\ f(i+1)),$$

where f(i) is the bit at the input of the inverse precoder, g(i) is the bit at the output of the inverse precoder, and m(i) is the masking bit at index i. In other words, g(i)=f(i) (no inverse preceding), if m(i)=0, and g(i)=f(i) ⊕ f(i+1) (inverse preceding), if m(i)=1.

This embodiment is a rate-100/108 code with 3-bit parity for use with a 10-bit error correction code. It uses the rate-16/17 modulation code described in the Applicants' U.S. Pat. No. 6,557,124, which is incorporated herein by reference in its entirety. That rate-16/17 modulation code is a strong MTR code that has been found to eliminate about half of the error events of type +-+ (which are the predominant error events in magnetic recording channels that are corrupted mainly by electronics noise and at the same time have a high normalized linear density). Furthermore, this rate-16/17 modulation code has an average transition density of 43.32%. This property is useful in magnetic recording channels where the data-dependent medium noise is not negligible. The encoder and decoder associated with this rate-16/17 strong MTR code is, as before, a block encoder and a block decoder, respectively.

As mentioned above, the rate-16/17 modulation code used in the present embodiment is designed to be used with a 1/(1 ⊕ D) precoder in the write path and a (1 ⊕ D) inverse precoder in the read path. (This is in contrast to the above embodiments using a rate-8/9 modulation code which use a 1/(1 ⊕ $D^2$) precoder in the write path and a (1 ⊕ $D^2$) inverse precoder in the read path.)

Table 5 compares the properties of the rate-100/108 code with 3-bit parity of the present embodiment with the rate 100/106 code using an 8/9 modulation code and 4-bit parity of FIG. 30.

| Rate | Modulation Code | Parity | k | I | ATD |
| --- | --- | --- | --- | --- | --- |
| 100/106 | 8/9 | 4-bit | 28 | 29 | 50.00% |
| 100/108 | 16/17 | 3-bit | 21 | 13 | 44.74% |

In Table 5, "ATD" is the average transition density and the remaining terms are as in Table 1. It can be seen that when compared to the reference rate-100/106 4-bit parity code, the rate-100/108 code with 3-bit parity of the present embodiment has a better k-constraint, a better I-constraint and a lower average transition density (ATD).

Figure 36:
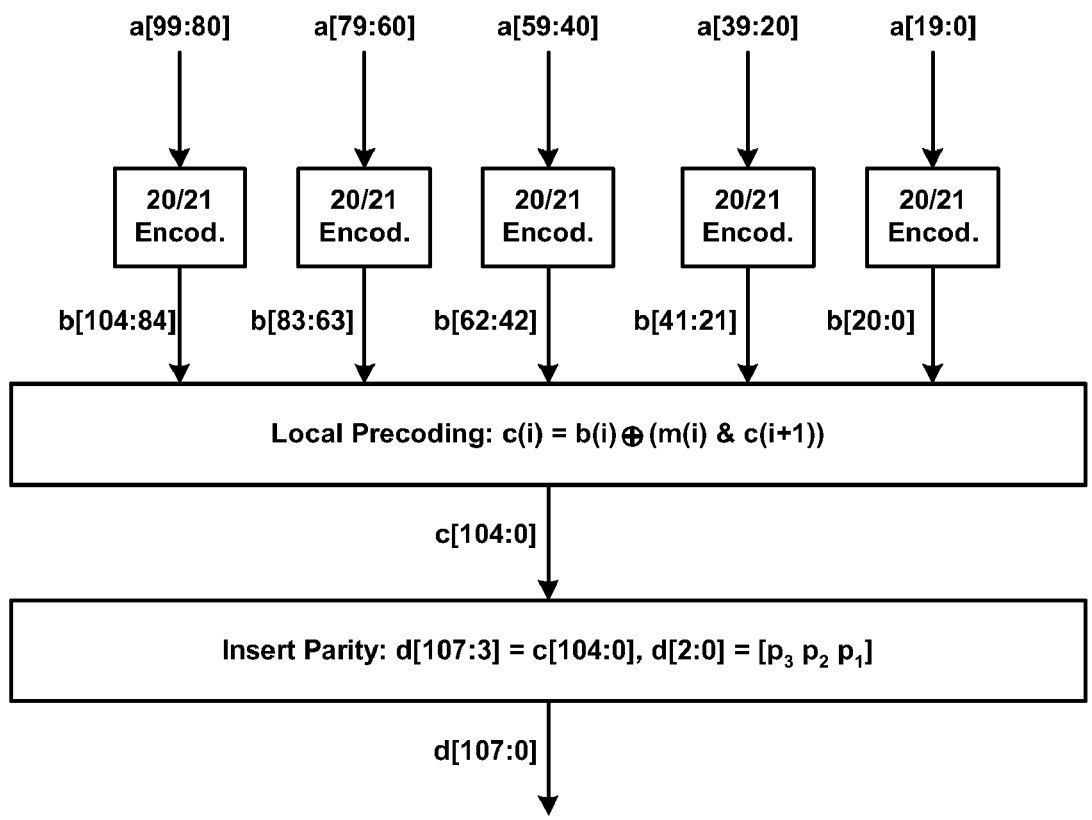
FIG. 36 shows the 20/21-based modular structure of the rate 100/108 block encoder according to one embodiment of the invention.
Figure 37:
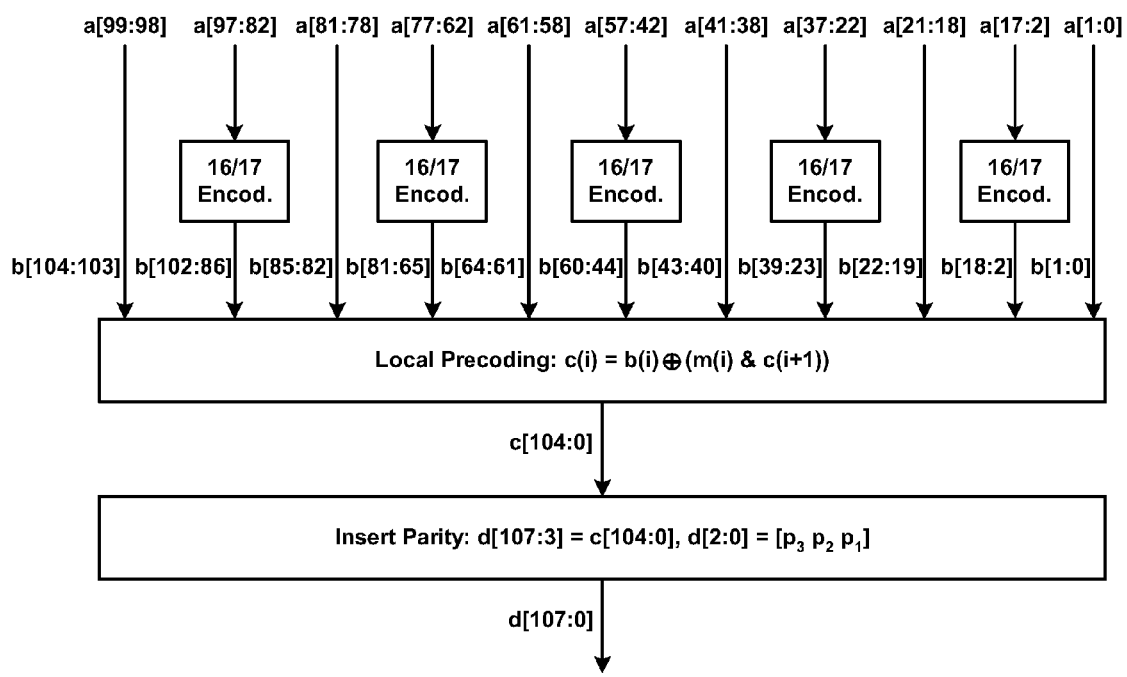
FIG. 37 shows the rate 100/108 block encoder according to one embodiment of the invention.

FIG. 37 shows schematically the rate-100/108 block encoder for a 10-bit error correction code of the present embodiment. FIG. 36 is an equivalent representation of the encoder, that shows the rate 20/21-based modular structure of the rate-100/108 block encoder of the present embodiment, as will be discussed further below.

The input of the encoder, after error correction coding, a[99:0], consists of ten 10-bit bytes, B9, . . . , B0. The five pairs of adjacent bytes B9/B8, B7/B6, B5/B4, B3/B2 and B1/B0 are mapped into five 21-bit codewords. As shown in FIGS. 36 and 37, this is done by applying the above-discussed rate-16/17 modulation code to the appropriate bits (FIG. 37) and can be considered to be the application of modulation coding using a set of rate-20/21 block encoders as shown in FIG. 36 that are implemented using the above-discussed rate-16/17 modulation code, but with the two leftmost bits and the two rightmost bits of each 21-bit codeword being uncoded.

The encoded signal is denoted by b[104:0]. Selective preceding is then applied using the masking bits m(i), 0≦i≦104, m(i)=1, for i=102, 101, 100, 99, 98, 97, 96, 95, 94, 93, 92, 91, 90, 89, 88, 87, 86, 81, 80, 79, 78, 77, 76, 75, 74, 73, 72, 71, 70, 69, 68, 67, 66, 65, 60, 59, 58, 57, 56, 55, 54, 53, 52, 51, 50, 49, 48, 47, 46, 45, 44, 39, 38, 37, 36, 35, 34, 33, 32, 31, 30, 29, 28, 27, 26, 25, 24, 23, 18, 17, 16, 15, 14, 13, 12, 11, 10, 9, 8, 7, 6, 5, 4, 3, 2, and m(i)=0 elsewhere. The encoded signal after this local preceding is denoted by c[104:0]. Finally, three parity bits that are computed using the generator polynomial 1+x+$x^3$ are inserted at the end of the codeword. The resulting modulation/parity codeword is d[107:0]. It should be noted that in this embodiment (unlike in the previous embodiments) there is no permutation of the data codeword.

Figure 38:
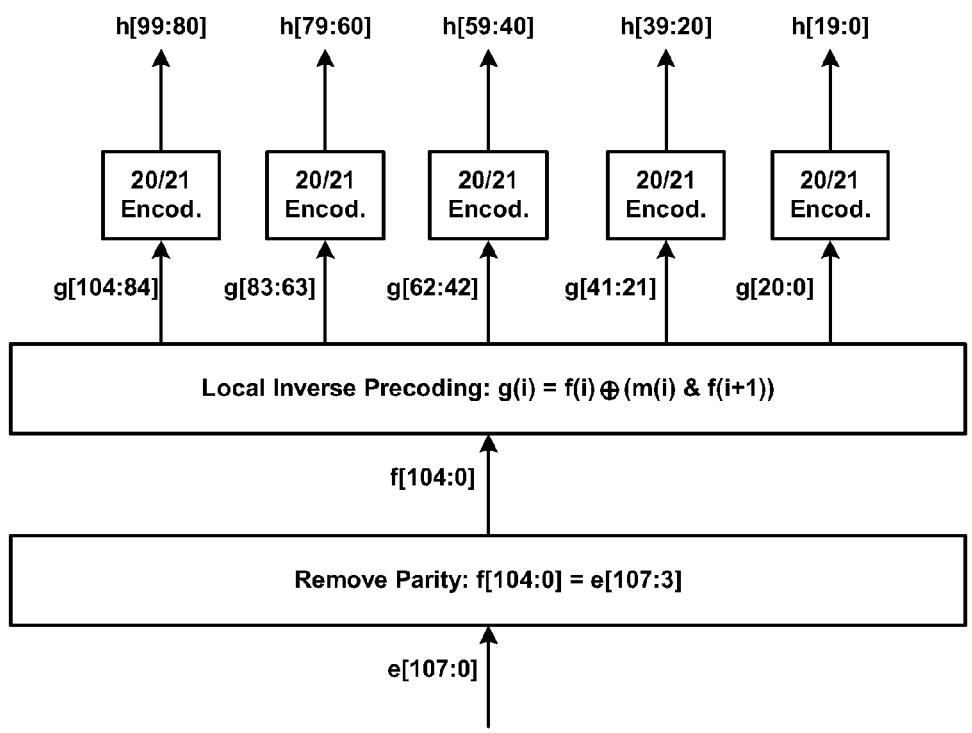
FIG. 38 shows the 20/21-based modular structure of the rate 100/108 block decoder according to one embodiment of the invention.
Figure 39:
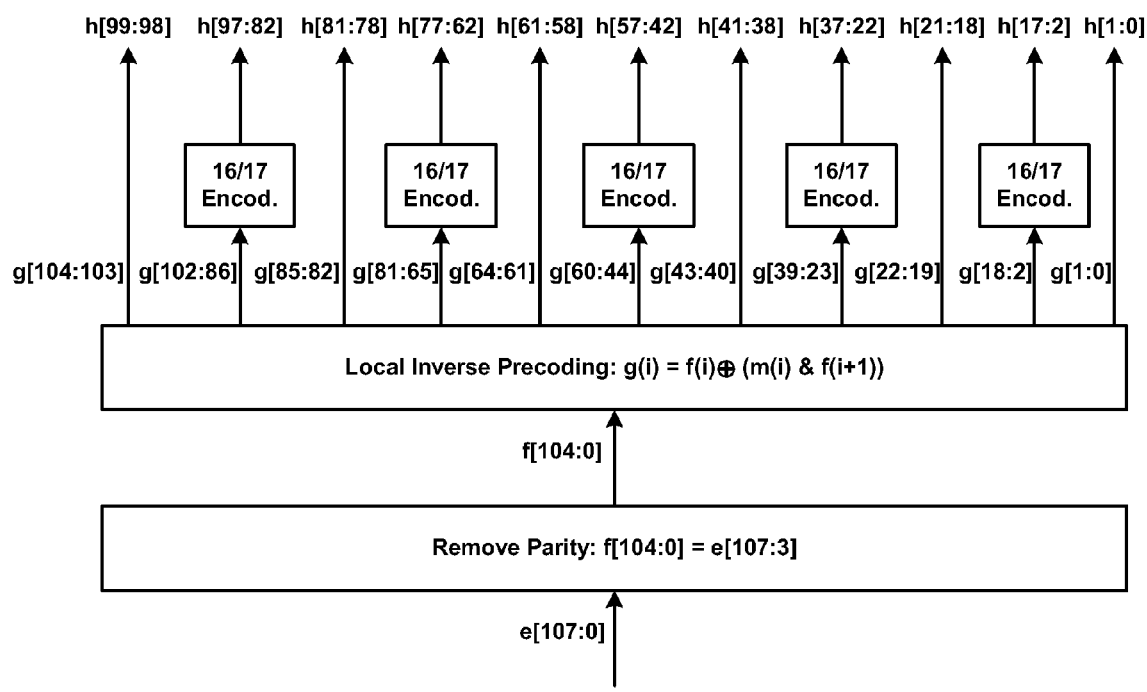
FIG. 39 shows the rate 100/108 block decoder according to one embodiment of the invention.

FIG. 39 shows schematically the corresponding rate-100/108 block decoder for a 10-bit error correction code. FIG. 38 is an equivalent representation of the decoder, that shows the rate-20/21-based modular structure of the rate-100/108 block decoder.

The input of the decoder e[107:0] is mapped into f[104:0] by removing the three parity bits. Local inverse preceding is then performed to obtain the array g[104:0], using the same masking bits m(i), 0≦i≦104, m(i)=1, for i=102, 101, 100, 99, 98, 97, 96, 95, 94, 93, 92, 91, 90, 89, 88, 87, 86, 81, 80, 79, 78, 77, 76, 75, 74, 73, 72, 71, 70, 69, 68, 67, 66, 65, 60, 59, 58, 57, 56, 55, 54, 53, 52, 51, 50, 49, 48, 47, 46, 45, 44, 39, 38, 37, 36, 35, 34, 33, 32, 31, 30, 29, 28, 27, 26, 25, 24, 23, 18, 17, 16, 15, 14, 13, 12, 11, 10, 9, 8, 7, 6, 5, 4, 3, 2, and m(i)=0 elsewhere, as were used for the preceding.

Finally, rate-16/17 decoding of the appropriate bytes is performed to give the output of the rate-100/108 decoder, being the array h(99:0]. (Again, as shown in FIG. 38, this operation can be considered to be the operation of a set of rate-20/21 block decoders that are implemented using the rate-16/17 modulation code and that leave some bits unchanged.)

The constraints in the data codeword d[107:0] of this embodiment that would be relevant to an implementation of a 16-state time-varying detector trellis and MTR checking in the post-processor are j=2 at the following 10 positions: 103, 89, 82, 68, 61, 47, 40, 26, 19, 5. and j=3 at the following 65 positions: 102, 101, 100, 99, 98, 97, 96, 94, 93, 92, 91, 90, 88, 81, 80, 79, 78, 77, 76, 75, 73, 72, 71, 70, 69, 67, 60, 59, 58, 57, 56, 55, 54, 52, 51, 50, 49, 48, 46, 39, 38, 37, 36, 35, 34, 33, 31, 30, 29, 28, 27, 25, 18, 17, 16, 15, 14, 13, 12, 10, 9, 8, 7, 6, 4.

As can be seen from the above, the present invention, in its preferred embodiments at least, uses local (selected) preceding and inverse preceding to reduce error propagation and thereby improve error rate performance. By avoiding the need to inverse precode some of the input data (i.e. the portion or portions of the input data that have not been precoded), error propagation caused by preceding can be reduced. Furthermore, permutation can be used to match timing recovery requirements and to facilitate more flexible design of modulation codes for use with, e.g., Reed-Solomon codes based on 8-bit or 10-bit symbols.

In preferred embodiments, specific codes for 8-bit and 10-bit Reed-Solomon symbol sizes based on a single rate-8/9 modulation code are described that, in addition to the above advantages, simplify the encoder/decoder implementation.

The foregoing description of the invention has been presented for purposes of illustration and description. It is not intended to be exhaustive or to limit the invention to the precise form disclosed, and other modifications and variations may be possible in light of the above teachings. The embodiments disclosed were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

The invention claimed is:

1. A method of encoding an input bit sequence, comprising:
   applying modulation coding to some or all of the input bit sequence; and
   precoding one or more selected portions of the input bit sequence after the modulation coding has been applied, wherein only those portions of the input bit sequence to which modulation coding has been applied are precoded.

2. The method of claim 1, further comprising changing the positions of modulation coded bits in the data sequence after the modulation coding has been applied.

3. A method of encoding an input bit sequence, comprising:
   applying modulation coding to a selected portion or portions of the input bit sequence; and applying precoding to the data bits encoded by the modulation coding, but not precoding any data bits that are not modulation coded.

4. The method of claim 3, further comprising changing the positions of modulation coded bits in the data sequence after the modulation coding has been applied.

5. A method of encoding a data sequence for storage, comprising:
- error correction coding the data sequence;
- modulation encoding all or part of the error correction coded data sequence; and
- changing the positions of modulation coded bits in the data sequence after the modulation encoding step on the basis of the error correction code used to error correction code the data sequence.

6. A method of encoding a data sequence for storage, comprising:
- error correction coding the data sequence;
- modulation encoding all or part of the error correction coded data sequence; and
- changing the positions of the modulation coded bits in the data sequence after the modulation encoding step on the basis of precoding to be applied to the data sequence.

7. A method of decoding a bit sequence read from a storage medium, comprising:
- inverse precoding one or more selected portions of the read bit sequence, wherein only those portions of the read bit sequence to which modulation coding has been applied are inverse precoded; and
- applying modulation decoding to some or all of the read bit sequence after the inverse precoding coding has been applied.

8. The method of claim 7, further comprising changing the positions of modulation coded bits in the read data sequence.

9. A method of decoding a bit sequence read from a storage medium, comprising:
- applying inverse precoding to read data bits that have been encoded by modulation coding, but not inverse precoding any data bits that are not modulation coded; and
- applying modulation decoding to the portion or portions of the read bit sequence that have been modulation encoded.

10. The method of claim 9, further comprising changing the positions of modulation coded bits in the read data sequence.

11. A method of decoding a data sequence read from a storage medium, comprising:
- changing the positions of bits in the read data sequence;
- modulation decoding all or part of the reordered data sequence; and
- error correction decoding the data sequence after the modulation decoding step;
- wherein the changing of the positions of bits in the read data sequence is based on the error correction code used to error correction code the data sequence.

12. A method of decoding a data sequence read from a storage medium, comprising:
- changing the positions of bits in the read data sequence;
- modulation decoding all or part of the reordered data sequence; and
- error correction decoding the data sequence after the modulation decoding step;
- wherein the changing of the positions of bits in the read data sequence is based on the inverse precoding to be applied to the data sequence.

* * * * *